US012575168B2

(12) United States Patent
Baburske

(10) Patent No.: US 12,575,168 B2
(45) Date of Patent: Mar. 10, 2026

(54) RC IGBT, METHOD OF PRODUCING AN RC IGBT AND METHOD OF CONTROLLING A HALF BRIDGE CIRCUIT

(71) Applicant: Infineon Technologies AG, Neubiberg (DE)

(72) Inventor: Roman Baburske, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 896 days.

(21) Appl. No.: 17/482,571

(22) Filed: Sep. 23, 2021

(65) Prior Publication Data

US 2022/0093585 A1 Mar. 24, 2022

(30) Foreign Application Priority Data

Sep. 24, 2020 (DE) .......................... 102020124901.2

(51) Int. Cl.
*H10D 84/80* (2025.01)
*H01J 37/24* (2006.01)
(Continued)

(52) U.S. Cl.
CPC .......... *H10D 84/811* (2025.01); *H01J 37/241* (2013.01); *H10D 12/038* (2025.01); *H10D 12/481* (2025.01); *H10D 62/127* (2025.01)

(58) Field of Classification Search
CPC ............. H01L 27/0629; H01L 27/0727; H01L 29/0696; H01L 29/66348; H01L 29/7397;
(Continued)

(56) References Cited

U.S. PATENT DOCUMENTS

2013/0264607 A1* 10/2013 Werber ............... H01L 29/7396
257/E29.197
2016/0352326 A1* 12/2016 Laven ................. H01L 27/0727
(Continued)

FOREIGN PATENT DOCUMENTS

DE 102014109475 A1 1/2015
DE 102016117264 A1 3/2018
DE 102019125007 A1 3/2021

OTHER PUBLICATIONS

Baburske, Roman, et al., "RCDC-IGBT Study for low-Voltage Applications", Proceedings of the 2016 28th International Symposium on Power Semiconductor Devices and ICs (ISPSD); Prague, Czech Republic, Jun. 12-16, 2016, pp. 347-350.
(Continued)

*Primary Examiner* — Fernando L Toledo
*Assistant Examiner* — Marshall Mu-Nuo Hatfield
(74) *Attorney, Agent, or Firm* — Murphy, Bilak & Homiller, PLLC

(57) ABSTRACT

An RC IGBT includes an active region with an IGBT section and a diode section. In a plurality of control trenches of the RC IGBT, there are a plurality of IGBT control electrodes and, electrically isolated from the IGBT control electrodes, a plurality of plasma control electrodes, each of the IGBT control electrodes and plasma control electrodes being electrically isolated from both load terminals of the RC IGBT. The IGBT section includes both a first subset of the IGBT control electrodes and a first subset of the plasma control electrodes. The diode section includes a second subset of the plasma control electrodes.

25 Claims, 13 Drawing Sheets

(51) Int. Cl.

| | |
|---|---|
| *H10D 12/00* | (2025.01) |
| *H10D 12/01* | (2025.01) |
| *H10D 62/10* | (2025.01) |

(58) Field of Classification Search

CPC .............. H01L 29/0834; H01L 29/407; H01L 29/8613; H01L 29/417; H02M 1/00; H02M 1/08; H02M 1/088

See application file for complete search history.

(56) References Cited

U.S. PATENT DOCUMENTS

| | | | | |
|---|---|---|---|---|
| 2018/0076309 | A1 * | 3/2018 | Philippou | ............ H10D 12/038 |
| 2018/0097093 | A1 * | 4/2018 | Pfirsch | ................ H01L 29/0696 |
| 2018/0269313 | A1 * | 9/2018 | Bina | .................... H01L 29/8083 |
| 2018/0286971 | A1 * | 10/2018 | Philippou | ........... H01L 29/7397 |
| 2019/0058057 | A1 * | 2/2019 | Eckel | .................. H01L 29/0696 |
| 2019/0067463 | A1 | 2/2019 | Abe et al. | |
| 2019/0386093 | A1 * | 12/2019 | Pfirsch | ................ H01L 29/1608 |
| 2020/0006538 | A1 * | 1/2020 | Kamibaba | ........... H01L 29/0696 |
| 2020/0058779 | A1 * | 2/2020 | Gejo | ................. H01L 29/66333 |
| 2020/0098747 | A1 * | 3/2020 | Tamura | .............. H01L 29/7397 |
| 2020/0194550 | A1 * | 6/2020 | Baburske | .......... H01L 21/26513 |
| 2020/0287028 | A1 * | 9/2020 | Kamibaba | ........... H01L 27/0716 |
| 2020/0343240 | A1 * | 10/2020 | Eguchi | ................. H01L 29/407 |

OTHER PUBLICATIONS

Mori, Mutsuhiro, et al., "An Innovative Silicon Power Device (i-Si) through Time and Space Control of a Stored Carrier (TASC)", Proceedings of the 30th International Symposium on Power Semiconductor Devices & ICs, Chicago, USA, May 13-17, 2018, pp. 520-523.

\* cited by examiner

RC IGBT, METHOD OF PRODUCING AN RC IGBT AND METHOD OF CONTROLLING A HALF BRIDGE CIRCUIT

TECHNICAL FIELD

This specification refers to embodiments of a power semiconductor device and to embodiments of a method of processing a power semiconductor device. In particular, this specification is related to embodiments of an RC IGBT, to embodiments of a corresponding RC IGBT production method and to embodiments of a method of operating a power semiconductor half bridge circuit comprising a first RC IGBT and a second RC IGBT. The RC IGBTs described herein are equipped with at least two kinds of control electrodes.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a forward conducting state and a blocking state. In some cases, the gate electrode may be included within a trench of the power semiconductor switch, wherein the trench may exhibit, e.g., a stripe configuration or a needle configuration.

Some power semiconductor devices further provide for a reverse conductivity; during a reverse conducting state, the power semiconductor device conducts a reverse load current. Such devices may be designed such that the forward load current capability (in terms of magnitude) is substantially the same as the reverse load current capability.

A typical device that provides for both forward and reverse load current capability is the reverse conducting (RC) IGBT. Typically, for an RC IGBT, the forward conducting state is controllable, e.g., by providing a corresponding signal to the gate electrodes, and the reverse conducting state is typically not controllable, but, due to a one or more diode structures in the RC IGBT, the RC IGBT assumes the reverse conducting state automatically if a reverse voltage is present at the load terminals.

It is of course possible to provide a reverse current capability by means of a separate diode; e.g., a diode connected anti-parallel to a regular (not reverse conducting) IGBT. The embodiments described herein, however, relate to the variant where both the IGBT structure and the diode structures are monolithically integrated within the same chip.

A high degree of controllability of an RC IGBT is desired in order to operate the RC IGBT safely and efficiently. This applies in particular if two RC IGBTs are used to form a power semiconductor half bridge circuit, e.g., as part of a circuit topology of a major home appliance, a general purpose drive, an electric-drive train, a servo drive, a traction, a (higher) power transmission facilities.

SUMMARY

According to an embodiment, an RC IGBT comprises an active region with an IGBT section and a diode section; a semiconductor body having a first side and a second side; a first load terminal at the first side and a second load terminal at the second side; a plurality of control trenches being arranged in parallel to each other along a first lateral direction and extending into the semiconductor body along a vertical direction, wherein the plurality of control trenches extend into both the IGBT section and the diode section; a plurality of IGBT mesas and a plurality of diode mesas in the semiconductor body, each of at least some of the mesas being laterally confined, along the first lateral direction, by at least one of the control trenches; in the plurality of control trenches, a plurality of IGBT control electrodes and, electrically isolated from the IGBT control electrodes, a plurality of plasma control electrodes, each of the IGBT control electrodes and plasma control electrodes being electrically isolated from both the first load terminal and the second load terminal. The IGBT section includes both a first subset of the IGBT control electrodes and a first subset of the plasma control electrodes. The diode section includes a second subset of the plasma control electrodes.

According to another embodiment, a method of operating a power semiconductor half bridge circuit comprising a first RC IGBT in accordance with embodiment described above and a second RC IGBT in accordance with embodiment described above is presented. The method comprises: providing a first IGBT control signal to the plurality of IGBT control electrodes of the first RC IGBT and providing a first plasma control signal to the plurality of the plasma control electrodes of the first RC IGBT; and providing a second IGBT control signal to the plurality of IGBT control electrodes of the second RC IGBT and providing a second plasma control signal to the plurality of the plasma control electrodes of the second RC IGBT.

According to another embodiment, a method of producing an RC IGBT comprises forming the following components: an active region with an IGBT section and a diode section; a semiconductor body having a first side and a second side; a first load terminal at the first side and a second load terminal at the second side; a plurality of control trenches being arranged in parallel to each other along a first lateral direction and extending into the semiconductor body along a vertical direction, wherein the plurality of control trenches extend into both the IGBT section and the diode section; a plurality of IGBT mesas and a plurality of diode mesas in the semiconductor body, each of at least some of the mesas being laterally confined, along the first lateral direction, by at least one of the control trenches; in the plurality of control trenches, a plurality of IGBT control electrodes and, electrically isolated from the IGBT control electrodes, a plurality of plasma control electrodes, each of the IGBT control electrodes and plasma control electrodes being electrically isolated from both the first load terminal and the second load terminal. The IGBT section includes both a first subset of the IGBT control electrodes and a first subset of the plasma control electrodes. The diode section includes a second subset of the plasma control electrodes.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIGS. 5-10 each schematically and exemplarily illustrate a section of a vertical cross-section of an RC IGBT in accordance with one or more embodiments;

DETAILED DESCRIPTION

Figure 1:
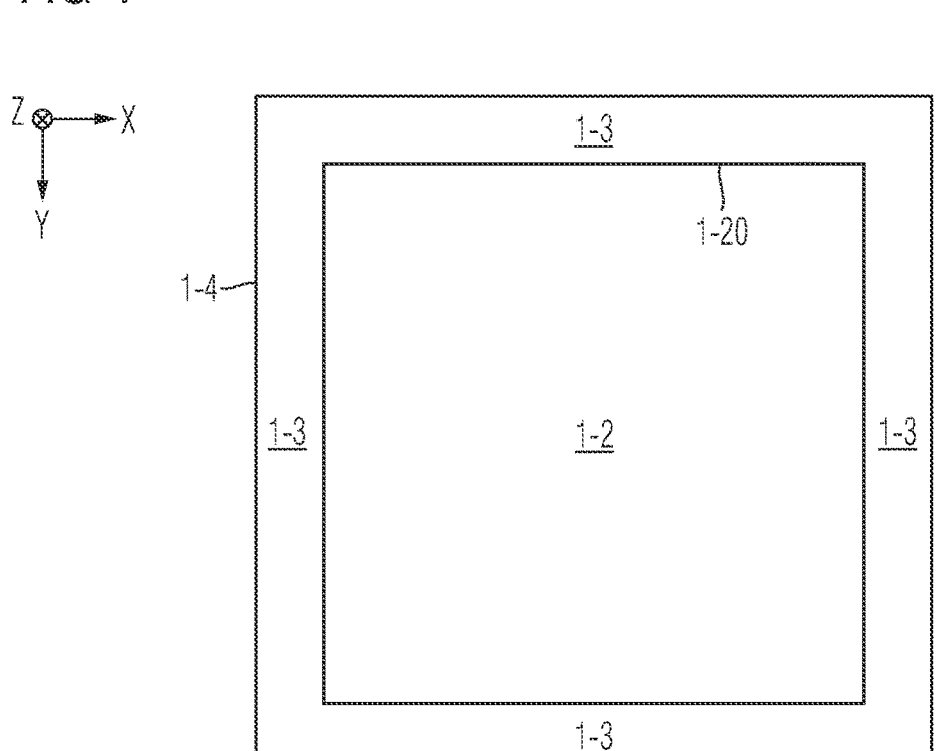
FIG. 1 schematically and exemplarily illustrates a section of a horizontal projection of an RC IGBT in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned herein can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned herein may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to an RC IGBT exhibiting a stripe or needle cell configuration, e.g., an RC IGBT to be used within a power converter or a power supply. Thus, in an embodiment, such RC IGBT can be configured to carry a load current that is to be fed to a load and/or, respectively, that is provided by a power source. For example, the RC IGBT may comprise a plurality of power semiconductor cells, such as monolithically integrated diode cells, derivatives of a monolithically integrated diode cell, monolithically integrated IGBT cells and/or derivatives thereof. Such diode/transistor cells may be integrated in a power semiconductor module. A plurality of such cells may constitute a cell field that is arranged within an active region of the RC IGBT.

The term "RC IGBT" as used in this specification intends to describe a power semiconductor device on a single chip with high voltage blocking and/or high current-carrying capabilities. In other words, embodiments of the RC IGBT described herein are single chip power semiconductor devices configured for high current, typically in the Ampere range, e.g., up to several Ampere or up to several ten or hundred Ampere, and/or high voltages, typically 100 V and above, e.g., up to at least 400 V or even more, e.g., up to at least 3 kV, or even up to 10 kV or more.

For example, the RC IGBT described below may be a single chip power semiconductor device exhibiting a stripe cell configuration and configured to be employed as a power component in a low-, medium- and/or high voltage application. Several single chip power RC IGBTs may be integrated in a module so as to form an RC IGBT module, e.g., for installation and use in a low-, medium- and/or high voltage application, such as a major home appliance, a general purpose drive, an electric-drive train, a servo drive, a traction, a (higher) power transmission facilities, etc.

For example, the term "RC IGBT" as used in this specification is not directed to a logic semiconductor device used for, e.g., storing data, computing data and/or other types of semiconductor based data processing.

Figure 13:
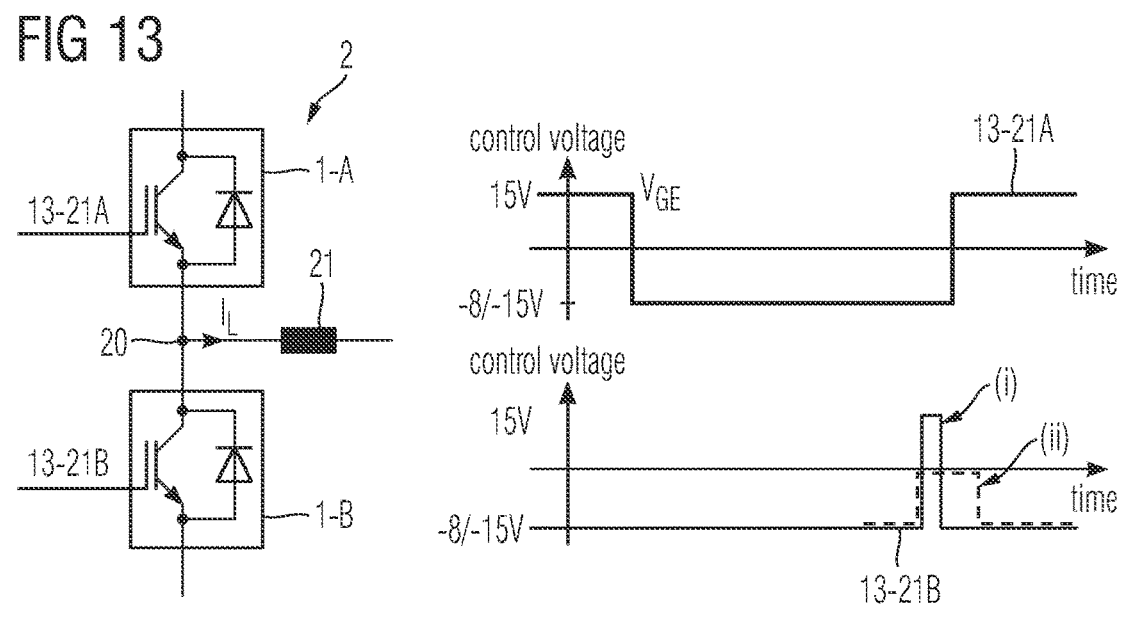
FIGS. 13-18 schematically and exemplarily illustrate RC IGBT control methods.
Figure 14:
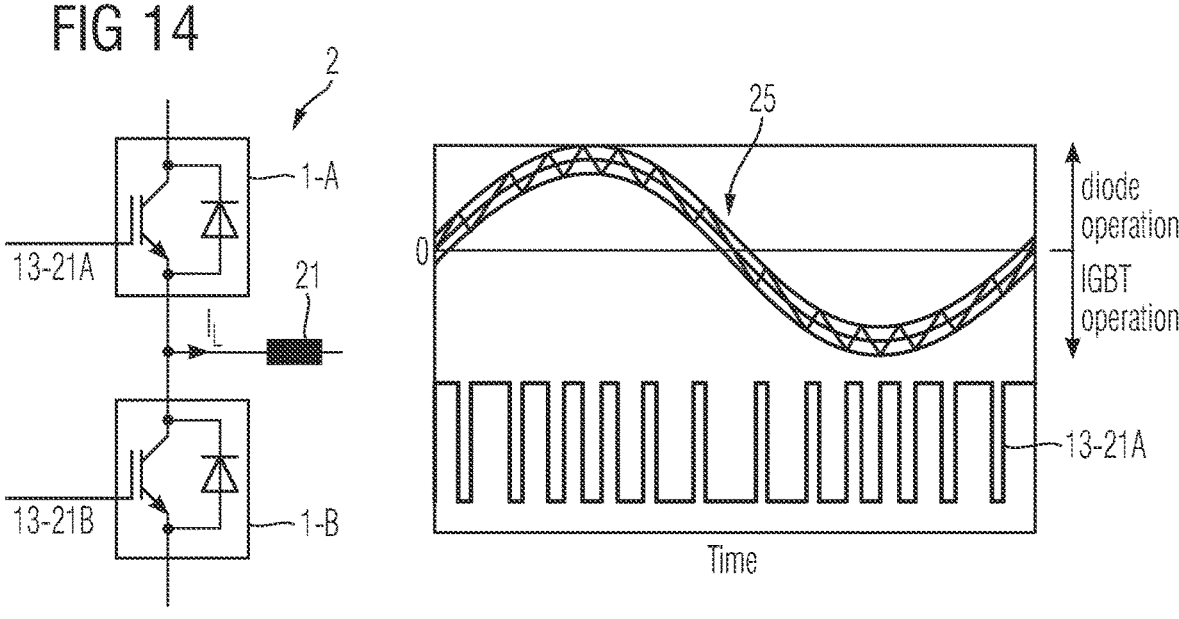
Figure 16:
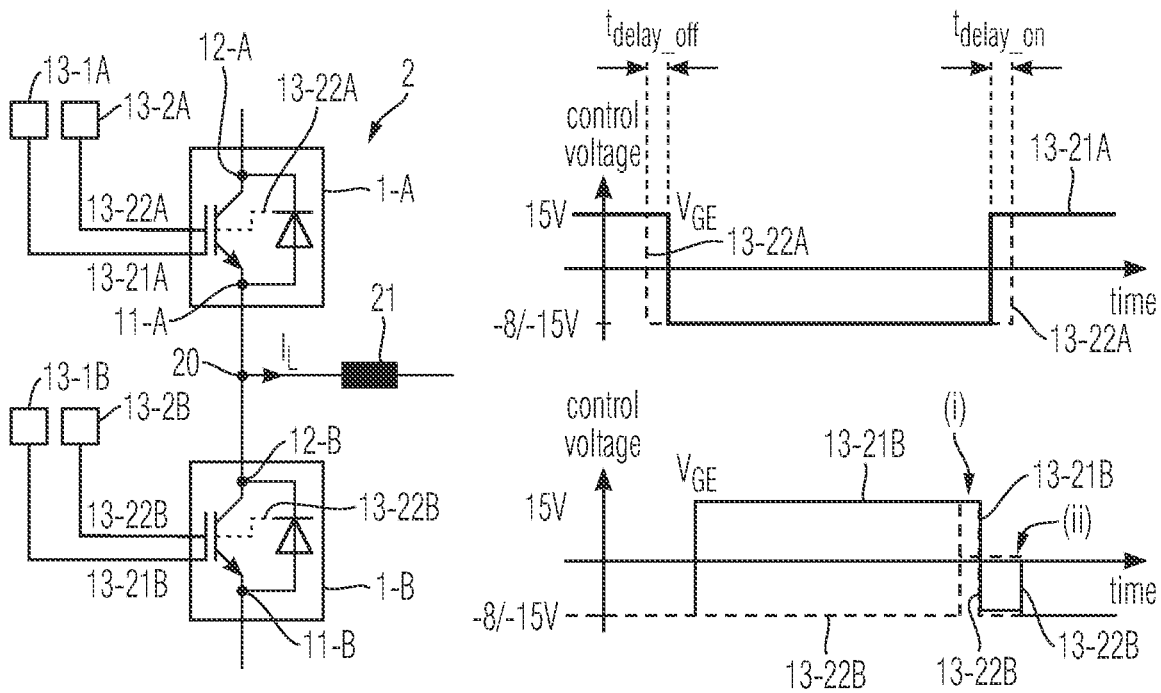

FIG. 1 schematically and exemplarily illustrates, in a simplified manner, a horizontal projection of an RC IGBT 1 in accordance with one or more embodiments. The RC IGBT 1 can for example be a single chip RC IGBT. Several of such single chip RC IGBTs may be integrated in a power semiconductor module, e.g., in a configuration that forms a power semiconductor half bridge circuit 2 as schematically illustrated in FIGS. 13, 14 and 16.

For describing the configuration of the RC IGBT 1, it will also be referred to FIGS. 2-4 in the following.

The RC IGBT 1 comprises an active region 1-2 with one or more diode sections 1-22 and one or more IGBT sections 1-21. Both the one or more diode sections 1-22 and the one or more IGBT sections 1-21 are integrated within the same chip of the RC IGBT 1.

An edge termination region 1-3 surrounds the active region 1-2. The edge termination region 1-3 is arranged external of the active region 1-2. The edge termination region 1-3 is laterally terminated by an edge 1-4. The edge 1-4 may form the chip edge of the power semiconductor device 1, e.g., originating from a dicing/sawing processing step.

In an embodiment, the vertical projection of a lateral circumference 1-20 of the active region 1-2 defines the boundary between the active region 1-2 and the edge termination region 1-3.

As used herein, the terms "edge termination region" and "active region" have the respective technical meaning the skilled person typically associates therewith in the context of power semiconductor devices, such as RC IGBTs. That is, the active region 1-2 is primarily configured for forward load current (i.e., "IGBT load current") and reverse load current (i.e., "diode load current") conduction and switching purposes, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-2.

The present specification relates to the configuration of the active region 1-2 and to method of controlling an RC IGBT having such configuration of the active region 1-2.

As will be elucidated in more detail below, the RC IGBT 1 can comprise, in the active region 1-2, the IGBT section(s) 1-21 and the diode section(s) 1-22. The different sections 1-21 and 1-22 may be laterally distributed within the active region 1-2, examples of such distribution being described in pending German Patent Applications DE 10 2019 125 007.2 and DE 10 2020 107 277.5.

In an embodiment, the active region 1-2 consists of the diode section(s) 1-22 and one IGBT section(s) 1-21.

In accordance with one or more embodiments described herein, none of the diode sections 1-22 is integrated into the IGBT section 1-21; hence, in such embodiment, the diode sections 1-22 and the IGBT section 1-21 section are not intermixed with each other. E.g., in an embodiment, the diode sections 1-22 do not comprise any semiconductor source regions (reference numeral 101) of the first conductivity type that are electrically connected to the first load terminal (reference numeral 11) and arranged adjacent to a respective one of the control trenches 14.

E.g., the diode sections 1-22 (which are not integrated into/intermixed with the IGBT section 1-21 and which are not electrically connected to the first load terminal 11 via source regions 101 of the first conductivity type in an embodiment) make up a significant portion of the active region 1-2. Hence, each of the diode sections 1-22 mentioned herein may be a "larger-diode-only" portion of the active region 1-2, in accordance with an embodiment. For example, at least ⅕ or at least ¼ or at least ⅓ of the active region 1-2 may be occupied by the diode section(s) 1-22, and the rest of the active region 1-2 may be occupied by the IGBT section(s) 1-21.

Irrespective of the chosen lateral-spatial distribution of the IGBT section 1-21 and diode sections 1-22, it may be ensured that, with respect to a volume of the active region 1-2, the ratio between the total of the IGBT section 1-21 and the total of the diode sections 1-22 is at least 1.5:1, or respectively, at least 2:1, i.e., larger or equal than 2:1. The chosen ratio may depend on the application in which the power semiconductor device 1 is employed. For example, irrespective of the chosen lateral-spatial distribution of the IGBT sections 1-21 and diode sections 1-22, it may be ensured that, with respect to a volume of the active region 1-2, the ratio between the IGBT section(s) 1-21 and the diode section(s) 1-22 is even larger than 3:1 or larger than 5:1.

In an embodiment, at least 75% of the total volume of the active region 1-2 may be occupied for forming the IGBT section(s) 1-21, and the remaining 25% (or a lower percentage share) of the active region 1-2 may be employed for forming the diode section(s) 1-22.

Furthermore, there may be a respective transition region (not-illustrated) arranged between a respective one of the diode section(s) 1-22 and a respective one of the IGBT section(s) 1-21. Each of the one or more transition regions is for example not equipped with a semiconductor source region and exhibits a comparatively low anode emitter efficiency (for example by exhibiting a higher dopant concentration in its portion of the optional barrier region 105 (mentioned further below) as compared to respective portion thereof in the diode section(s) 1-22), in accordance with an embodiment.

If the one or more transition regions is/are provided, the portion occupied thereby is smaller than 20%, smaller than 10% or even smaller than 5% of the total lateral area (horizontal cross-sectional area) of active region 1-2, in accordance with an embodiment.

In an embodiment, the total lateral area (horizontal cross-sectional area) of the diode sections 1-22 forms a portion of 5% to 40%, or a portion of 15% to 35% of the total lateral area (horizontal cross-sectional area) of both the diode sections 1-22 and the IGBT section 1-21. Said lateral areas may be determined at a first side 110 of a semiconductor body 10, which may be a frontside.

Furthermore, each of the diode sections 1-22 may have a lateral area and a circumference defining the lateral area, wherein each diode section 1-22 obeys the relation that the square of the circumference divided by the area is smaller or equal to 40 or smaller or equal to 30.

In the following, reference will be also be made to "the" diode section 1-22 and "the" IGBT section 1-21. It shall be understood that the explanation provided below with respect to these sections 1-21 and 1-22 may apply to each IGBT section 1-21 or, respectively, each diode section 1-22 that are provided in the active region 1-2. For example, if more than one IGBT section 1-21 is provided, each IGBT section 1-21 may be equally configured (wherein, for example, the IGBT sections 1-21 may differ from each other in total lateral extension or exhibit identical total lateral extensions). Accordingly, if a plurality of diode sections 1-22 is provided, each diode section 1-22 may be equally configured (wherein, for example, the diode sections 1-22 may differ from each other in total lateral extension or exhibit identical total lateral extensions).

Figure 2:
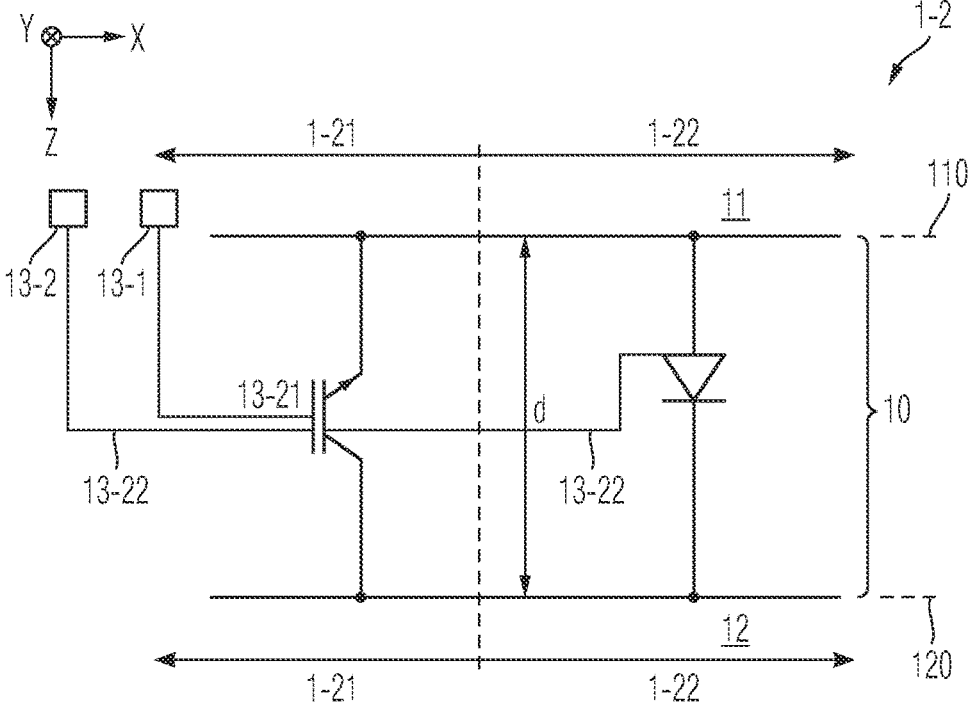
FIG. 2 schematically and exemplarily illustrates a simplified representation of an RC IGBT in accordance with one or more embodiments.

Now also referring to FIG. 2, the semiconductor body 10 of the RC IGBT 1 may extend in both the active region 1-2 and the edge termination region 1-3 and has said first side (herein also referred to as frontside) 110 and a second side (herein also referred to as backside) 120. The frontside 110 and the backside 120 may vertically terminate the semiconductor body 10.

A thickness d of the semiconductor body 10 can be defined as the distance, in the active region 1-2, along the vertical direction Z between the frontside 110 and the backside 120.

In the lateral directions, the semiconductor body 10 may be terminated by the edge 1-4 (cf. FIG. 1). Furthermore, both the frontside 110 and the backside 120 may extend laterally along both the first lateral direction X and the second lateral direction Y. For example, both the frontside 110 and the backside 120 may form a respective horizontal surface of the semiconductor body 10.

In an embodiment, a total lateral extension of the IGBT section 1-21 in at least one of the first lateral direction X or the second lateral direction Y amounts to at least 50% of the semiconductor body thickness d. The total lateral extension of the IGBT section 1-21 may also be greater than 50% of the thickness d, e.g., greater than 2*d, or even greater than 5*d.

In an embodiment, a total lateral extension of each of the diode sections 1-22 in at least one of the first lateral direction X or the second lateral direction Y amounts to at the semiconductor body thickness d or to at least the thickness of a drift region 100. The total lateral extension of the diode section 1-22 may also be greater than d. For example, the lateral area (horizontal cross-sectional area) of each of at least two of the diode sections 1-22 has a minimum lateral extension along the first lateral direction X and/or along the second lateral direction Y amounting at least 50% of the semiconductor body thickness d or to at least 50% of the drift region thickness.

Each of a first load terminal 11 and an IGBT control terminal 13-1 and a plasma control terminal 13-2 may be at the semiconductor body frontside 110, and a second load terminal 12 can be at the semiconductor body backside 120.

The IGBT section 1-21 is configured for conduction of a forward load current between the first load terminal 11 and the second load terminal 12, e.g., if the electrical potential at the second load terminal 12 is greater than the electrical potential at the first load terminal 11. The forward load current can hence be considered as an IGBT load current.

The diode section 1-22 is configured for conduction of a diode load current (herein also referred to as "reverse load current") between the first load terminal 11 and the second load terminal 12, e.g., if the electrical potential at the second load terminal 12 is lower than the electrical potential at the first load terminal 11. The diode load current can hence be considered as a reverse load current.

In an embodiment, the diode section 1-22, which conducts the diode load current, can be spatially separated from the IGBT section 1-21, which conducts the forward load current. As indicated above, the diode section 1-22 is not part of the IGBT section 1-21, but separated therefrom, and for example does not include any source region 101 of the first conductivity type electrically connected to the first load terminal 11; rather, the diode section 1-22 is a "large diode-only region" of the active region 1-2, in accordance with some embodiments.

E.g., in an embodiment, a path of the forward load current formed in the semiconductor body 10 and a path of the diode load current formed in the semiconductor body 10 do not spatially overlap considerably with each other. For example, none or less than 20% or even less than 10% of the forward (IGBT) load current flows through the diode section(s) 1-22.

Furthermore, in an embodiment, the current flow in the diode section 1-22 does change by less than 50%, or less than 30% or even less than 20% when the IGBT control signal is changed (e.g., the control signal provided to control electrodes 141 mentioned below). E.g., the diode section 1-22 is independent from an IGBT control signal (e.g., the control signal provided to control electrodes 141 mentioned below). For example, the diode section 1-22 may be configured such that it conducts the diode load current as soon as the electrical potential (of the typical polarity) at the second load terminal 12 is lower (at least by the diode section internal threshold voltage) than the electrical potential at the first load terminal 11, irrespective of the IGBT control signal provided to the IGBT section 1-21, that is, irrespective of the current potential of the control electrodes 141.

In accordance with the terminology typically associated with RC IGBTs, the IGBT control terminal 13-1 can be a first gate terminal, the plasma control terminal 13-2 can be a second gate terminal, the first load terminal 11 can be an emitter terminal and the second load terminal 12 can be a collector terminal.

E.g., the first load terminal 11 comprises a frontside metallization and/or the second load terminal 12 comprises a backside metallization. For example, the first load terminal 11 is an emitter terminal and the second load terminal 12 is a collector terminal. At the frontside 110, the semiconductor body 10 may interface with the frontside metallization. At the backside 120, the semiconductor body 10 may interface with the backside metallization.

In an embodiment, the first load terminal 11 (e.g., said frontside metallization) laterally overlaps, that is, along the first lateral direction X and/or the second lateral direction Y and/or combinations thereof, with the active region 1-2. It shall be noted that the first load terminal 11 may be laterally structured, e.g., so as to establish local contacts with the semiconductor body 10 at the frontside 110. E.g., as exemplary illustrated in FIGS. 3 and 4, said local contacts can be established by means of first contact plugs 111 penetrating an insulation structure 119 so as to contact mesas 17, 18 formed in the semiconductor body 10.

Analogously, in an embodiment, the second load terminal 12 (e.g., said backside metallization) laterally overlaps, that is, along the first lateral direction X and/or the second lateral direction Y and/or combinations thereof, with the active region 1-2. It shall be noted that the second load terminal 12 is for example not structured but formed homogeneously and monolithically at the semiconductor body backside 120, e.g., so as to establish a laterally homogeneous contact (i.e., a contiguous contact surface) with the semiconductor body 10 at the backside 120. Such homogeneous structure may also be implemented in regions where the second load terminal 12 laterally overlaps with the edge termination region 1-3.

For example, the lateral boundary of the active region 1-2 is defined by the lateral boundary of the outermost power cells of the IGBT section(s) 1-21 and or of the diode section(s) 1-22. Hence, the lateral boundary of the active region 1-2 may be defined at the frontside 110. For example, all functional elements to enable conduction of the diode load current and the forward load current are present in the active region 1-2 of the RC IGBT 1, e.g., including at least a part of the first load terminal 11 (e.g., a frontside metal contact thereof, e.g., one or more of the first contact plugs 111), source region(s) 101, a body region 102, a drift region 100, an IGBT emitter region 103, a diode emitter region 104 and the second load terminal 12 (e.g., a backside metal thereof), as will be explained in more detail below.

Furthermore, the lateral transition (along the first or second lateral direction X; Y or combinations thereof) between the active region 1-2 and the edge termination region 1-3 may extend exclusively along the vertical direction Z, in accordance with an embodiment. As explained above, the lateral boundary of the active region 1-2 may be defined at the frontside 110, and a vertical projection along the vertical direction Z of such defined lateral boundary may hence be theoretically observed at the backside 120.

Figure 3:
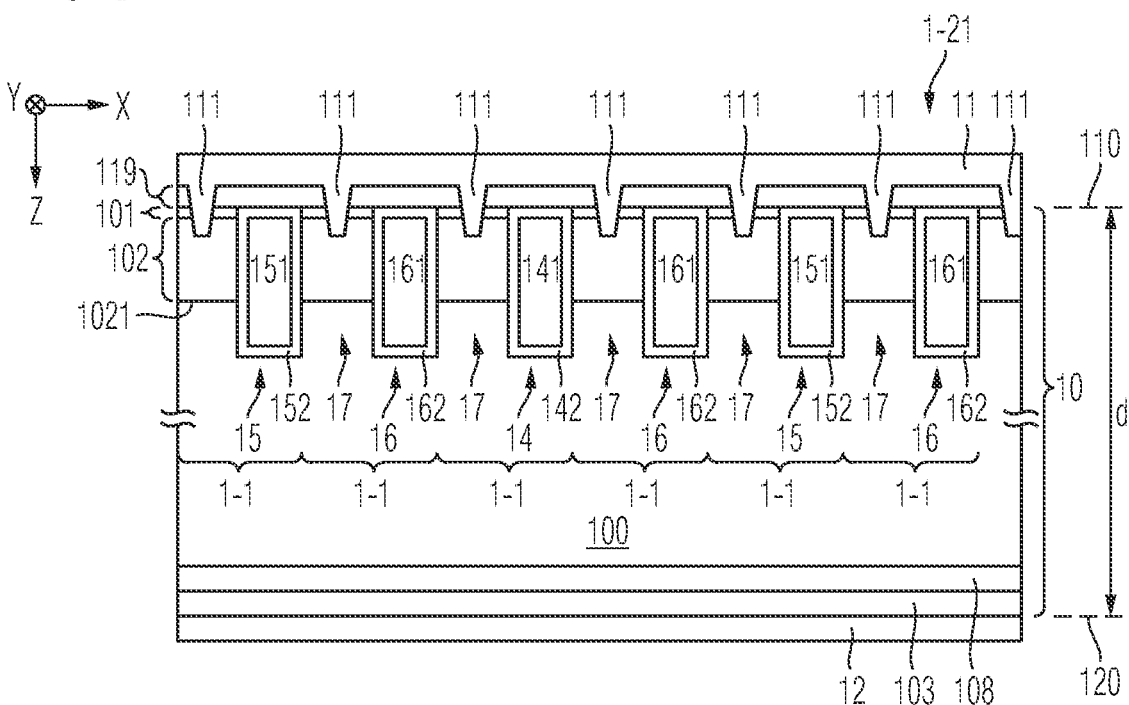
FIG. 3 schematically and exemplarily illustrates a section of a vertical cross-section of an IGBT section of an RC IGBT in accordance with one or more embodiments.
Figure 4:
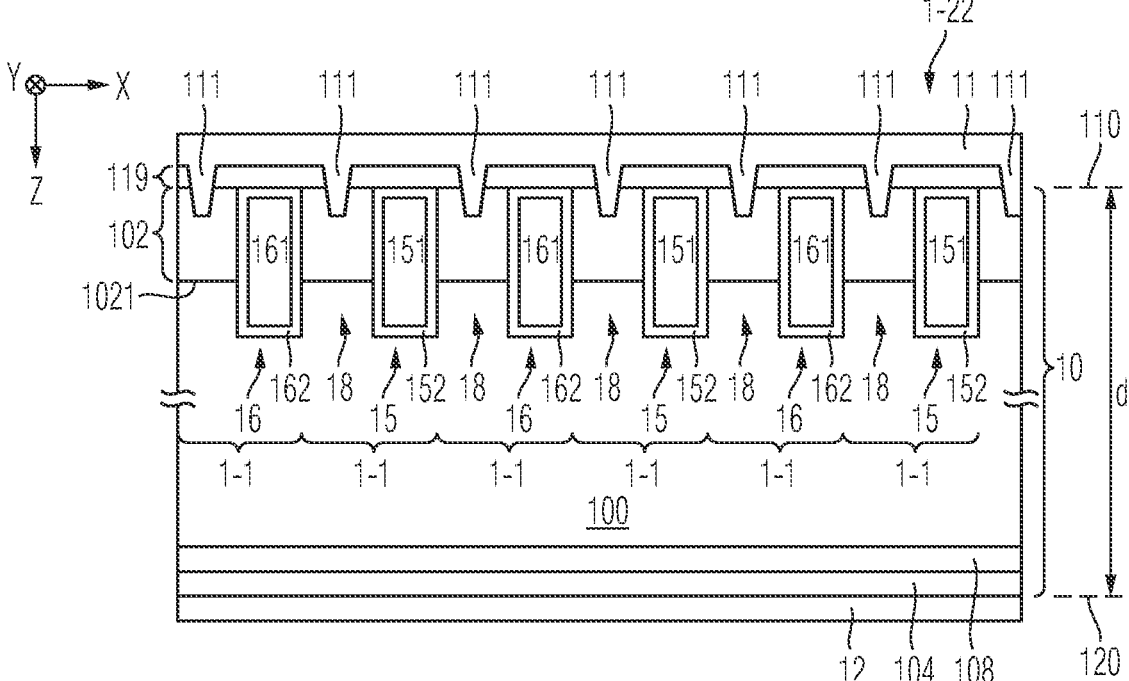
FIG. 4 schematically and exemplarily illustrates a section of a vertical cross-section of a diode section of an RC IGBT in accordance with one or more embodiments.

Now referring to FIGS. 3 to 4 in more detail, a plurality of trenches may extend into the semiconductor body 10. The trenches may include one or more IGBT control trenches 14, one or more plasma control trenches 15, and/or one or more source trenches 16. The trenches 14, 15 and 16 are arranged in parallel to each other along the first lateral direction X and extend into the semiconductor body 10 along the vertical direction Z. Each trench may have a stripe configuration extending along the second lateral direction Y from a respective first section of the lateral circumference 1-20 (cf. FIG. 1) towards a respective second section of the lateral circumference 1-20 opposite of the respective first section. Each trench 14, 15, 16 houses a respective trench electrode 141, 151 and 161 that may be electrically connected to a defined electrical potential, e.g., to the potential of the one of the IGBT control terminal 13-1, the plasma control terminal 13-2 or the first load terminal 11. That is, the electrical potentials of the IGBT trench electrodes 141, 151, 161 may differ from each other.

The trench electrodes 141, 151, 161 are isolated from the semiconductor body 10 by a respective trench insulator 142, 152, 162.

Two adjacent trenches may define a respective mesa in the semiconductor body 10. The mesas include IGBT mesas 17 and diode mesas 18.

For example, each trench 14, 15, 16 may have a stripe configuration, meaning that the respective trench length (e.g., along the second lateral direction Y) is much greater than the respective trench width (e.g., along the first lateral direction X). Hence, also each mesa 17, 18 may have a stripe configuration.

The trench electrodes 141 can be electrically connected to the IGBT control terminal 13-1 and are hence referred to as IGBT control electrodes 141. Via the IGBT control terminal 13-1, the IGBT control electrodes 141 may be provided with an IGBT control signal 13-21.

The trench electrodes 151 can be electrically connected to the plasma control terminal and are hence referred to as plasma control electrodes 151. Via the plasma control terminal 13-2, the plasma control electrodes 151 may be provided with a plasma control signal 13-22.

The trench electrodes 161 can be electrically connected to the first load terminal 11 and are hence referred to as source trench electrodes 161.

A further type of trench can be another trench, whose trench electrode is neither electrically connected to the first load terminal 11 nor to the IGBT/plasma control terminal 13-1/2. E.g., in one embodiment, such trench is a floating trench and its trench electrode is connected to no defined electrical potential, but electrically floating. In another embodiment, such trench is a dummy trench and its trench electrode is electrically connected to either the IGBT control terminal 13-1 or the plasma control terminal 13-2 but does not directly control conduction of the forward load current as no electrically connected source region 101 (connected to the first load terminal 11) is arranged adjacent to the further type trench. In yet another embodiment, the trench electrode of the further type trench is connected to an electrical potential different from the electrical potential of the IGBT/plasma control terminal 13-1/2 and different from the electrical potential of the first load terminal 11.

Each trench type can be of equal dimensions in terms of width along the first lateral direction X and depth along the vertical direction Z (e.g., a distance between frontside 110 and a trench bottom) and/or length along the second lateral direction Y.

The IGBT section 1-21 may comprise a plurality of IGBT cells, each IGBT cell having a certain trench pattern, i.e., a lateral sequence (along the first lateral direction X) of trenches of specific types, e.g. one or more IGBT control trenches 14, one or more plasma control trenches 15, and zero or more source trenches 16 and zero or more other trenches.

Analogously, each of the diode sections 1-22 may comprise a number of diode cells, each diode cell having a certain trench pattern, i.e., a lateral sequence of trenches of specific types, e.g. one or more plasma control trenches 15, zero or more source trenches 16 and/or zero or more other trenches.

In an embodiment, none of the diode sections 1-22 includes one of the IGBT control trenches 14, e.g., in the diode sections 1-22, there is no trench electrode electrically connected to the IGBT control terminal 13-1. For example, none of the IGBT control trenches 14 extends into one or more of the diode sections 1-22. For example, the diode sections 1-22 are hence separated from the IGBT section 1-21 and in particular from the IGBT control trenches 14 (i.e., from the IGBT control trench electrodes 141). This may allow for achieving "good" diode properties, such as little or no dependence on the potential of the IGBT control electrodes 141 and/or low switching losses.

It may be provided that the trenches in both the IGBT section 1-21 and the diode section 1-22 are laterally arranged next to one another in accordance with the same lateral trench pitch; i.e., the lateral trench pitch (that is, the distance along the first lateral direction X between two adjacent trenches) does not alter between the sections 1-21 and 1-22, in accordance with an embodiment.

The lateral trench pitch may, in an embodiment, define a lateral distance between two adjacent trenches (and therewith, e.g., the mesa width) of no more than ⅓₀ or no more than ⅟₆₀ of the semiconductor body thickness d.

Also, the trenches 14, 15, 16 may, in an embodiment, each exhibit the same trench depth (total vertical extension). For example, the lateral trench pitch may define a lateral distance between two adjacent trenches of no more than 50% or no more than 30% of the trench depth.

In an embodiment, the lateral trench pitch may define a lateral distance between two adjacent trenches of no more than 10 µm, or no more than 5 µm, or no more than 1 µm. For example, adjacent trenches are hence laterally displaced from each other by no more than 1 µm.

Hence, the width of each mesa 17, 18 is within the range as defined by the lateral trench pitch.

As explained above, the lateral trench pitch may be identical for both sections 1-21 and 1-22, or it varies between the sections. In a further embodiment, the mesa width in the IGBT section 1-21 is less than 80%, less than 65% or even less than 50% of the mesa width in the diode section 1-22. For example, the average density of the total of the trench electrodes 141, 151, 161 can also be the same for both sections 1-21 and 1-22. However, the trench pattern, e.g., the arrangement of the different types of trenches may vary between the sections 1-21 and 1-22. One exemplary variation is that the density of IGBT control electrodes 141 in the IGBT section 1-21 is at least twice as high as the density of IGBT control electrodes 141 in the diode section 1-22 (which may even amount to zero).

In an illustrative example, the total number of trench electrodes 141, 151, 161 in the IGBT section 1-21 is 120, and 40 trench electrodes are IGBT control electrodes 141, yielding an IGBT control electrode density of 30%. E.g., the total number of trench electrodes in the diode section 1-22 is five, and no more than five trench electrodes are IGBT control electrodes 141, yielding an IGBT control electrode density of no more than 10%. In an embodiment, said trench electrodes in the diode section 1-22 do not include any IGBT control trench electrode 141.

In an embodiment, at least 50% of the trench electrodes of the trenches in the diode section 1-22 are electrically connected to the first load terminal 11, i.e., at least 50% of the trench electrodes of the trenches in the diode section 1-22 are source trench electrodes 161 of source trenches 16.

In an embodiment, at least 50% of the trench electrodes of the trenches in the IGBT section 1-21 are electrically connected to the first load terminal 11, i.e., at least 50% of the trench electrodes of the trenches in the IGBT section 1-21 are source trench electrodes 161 of source trenches 16.

For example, the trench electrodes in the diode section 1-22 are either source trench electrodes 161 or plasma control electrodes 151. Furthermore, all or some of the diode mesas 18 in the diode section 1-22 may be electrically connected to the first load terminal 11, e.g., by means of the first contact plugs 111.

Still referring to FIGS. 1-4, the RC-IGBT 1 further comprises a drift region 100 of the first conductivity type formed in the semiconductor body 10 and extending into the diode section 1-22 and the IGBT section 1-21.

A body region 102 of the second conductivity type is formed in the IGBT mesas 17 and the diode mesas 18 of the semiconductor body 10 in the diode sections 1-22 and the IGBT section 1-21. At least portions of the body region 102 are electrically connected to the first load terminal 11. The body region 102 may form pn-junctions to mesa subsections of the first conductivity type. E.g., in some mesas (cf. reference numeral 19 in the other drawings), the respective portion of the body region 102 is not electrically connected to the first load terminal 11 in order to form "dummy mesas", i.e., those not used for load current conduction, as will be described later.

In the IGBT section 1-21, source regions 101 of the first conductivity type are arranged at the frontside 110 and electrically connected to the first load terminal 11. The source regions 101 are, e.g., only locally provided in the IGBT section 1-21 and do for example not extend into the diode sections 1-22.

The body region 102 may be arranged in electrical contact with the first load terminal 11, e.g., by means of the first contact plugs 111. In each IGBT cell of the IGBT section 1-21, can furthermore be provided at least one of the source regions 101 of the first conductivity type arranged in electrical contact with the first load terminal 11, e.g., also by means of the first contact plugs 111.

A larger part of the semiconductor body 10 is formed as the drift region 100, which is of the first conductivity type, and which may interface with the body region 102 and form a pn-junction 1021 therewith. The body region 102 isolates the source regions 101 from the drift region 100. Herein, the term "body region 102" refers to the semiconductor region of the second conductivity type electrically connected, at the frontside 110, to the first load terminal 11. This region 102 extends into both the IGBT section 1-21 and the diode section 1-22 (which could hence, there, also be referred to as "diode anode region" or the like). The implementation of the body region 102 in the IGBT section 1-21 may not or may differ from the implementation of the body region 102 in the diode sections 1-22, e.g., in terms of dopant concentration, dopant dose, dopant profile and/or spatial extension.

Upon receipt of the IGBT control signal 13-21, e.g., provided by a non-illustrated first gate driver unit, each IGBT control electrode 141 can induce an inversion channel in a section of the body region 102 adjacent to the respective IGBT control electrode 141. Thus, each of the number of IGBT cells may be configured for conducting at least a portion of the forward load current between the first load terminal 11 and the second load terminal 12.

The above described basic configuration of the IGBT cells in the IGBT section 1-21 of the RC IGBT 1 is as such known to the skilled person, and the present specification employs the term "IGBT cell" within the scope of the technical meaning the skilled person typically associates therewith.

In an embodiment, the drift region 100 extends along the vertical direction Z, until it interfaces with a field stop layer 108, wherein the field stop layer 108 is also of the first conductivity type, but exhibits a higher dopant dose as compared to the drift region 100. The field stop layer 108 is typically of significantly smaller thickness than the drift region 100.

The drift region 100, or, if present, the field stop layer 108, extends along the vertical direction Z until interfacing with either an IGBT emitter region 103 of the IGBT section 1-21 and a diode emitter region 104 of the diode section 1-22.

The diode emitter region 104 is of the first conductivity type and electrically connected to the second load terminal 12 and coupled to the drift region 100, e.g., by means of the field stop layer 108.

The IGBT emitter region 103 is of the second conductivity type and electrically connected to the second load terminal 12 and coupled to the drift region 100, e.g., by means of the field stop layer 108.

Both the IGBT emitter region 103 of the IGBT section 1-21 and the diode emitter region 104 of the diode section 1-22 can be arranged in electrical contact with the second load terminal 12.

Overall, the IGBT emitter region 103 may act as an emitter of the second conductivity type. Furthermore, the IGBT emitter region 103 does in some embodiments not comprise any section of the first conductivity type, which exhibit a rather high dopant concentration, typically in the range of $10^{16}$ cm$^{-3}$ to $10^{20}$ cm$^{-3}$, rather, the diode cathode region 104 is exclusively formed in the diode section 1-22, in accordance with some embodiments. In other embodiments, the IGBT emitter region 103 may comprise one or sections of the first conductivity type, e.g., only in a certain subsection of the IGBT emitter region 103, as will be described further below.

In an embodiment, the average dopant concentration of the drift region 100 may be in the range of $10^{12}$ cm$^{-3}$ to $10^{14}$ cm$^{-3}$.

In an embodiment, the dopant concentration of each source region 101 in the IGBT section 1-21 may be in the range of $10^{19}$ cm$^{-3}$ to $10^{21}$ cm$^{-3}$.

In an embodiment, the dopant concentration of the body region 102 may be in the range of $10^{16}$ cm$^{-3}$ to $10^{18}$ cm$^{-3}$. As described above, e.g., the dopant concentration of the body region 102 in the IGBT section 1-21 may be different from the dopant concentration of the body region 102 in the diode section 1-22.

In an embodiment, the dopant concentration of the (optional) field stop layer 108 may be in the range of $10^{14}$ cm$^{-3}$ to $3*10^{16}$ cm$^{-3}$.

In an embodiment, the dopant concentration of the IGBT emitter region 103 may be in the range of $10^{16}$ cm$^{-3}$ to $10^{18}$ cm$^{-3}$. However, in an embodiment, the net dopant concentration may vary (and even change is polarity) along the lateral extension of the IGBT emitter region 103.

In an embodiment, the dopant concentration of the diode emitter region 104 may be in the range of $10^{19}$ cm$^{-3}$ to $10^{21}$ cm$^{-3}$. However, in an embodiment, the net dopant concentration may vary (and even change is polarity) along the lateral extension of the diode emitter region 104.

It shall be noted that the trench patterns illustrated in FIGS. 3 and 4 are only exemplary; other trench patterns are possible and will be described further below.

In an embodiment, the diode section 1-22 is not equipped with source regions 101, e.g., at least not with source regions 101 arranged adjacent to a respective one of the IGBT control trenches 14. E.g., in the diode section 1-22, there is no doped semiconductor region of the first conductivity type electrically connected to the first load terminal 11. Rather, for forming the diode configuration in the diode section 1-22 for conduction of the diode load current, only the body region 102 is electrically connected to the first load terminal 11, wherein the body region 102 forms the pn-junction 1021 with, e.g., the drift region 100, and along the vertical direction Z towards the second load terminal 12, below said pn-junction 1021, there is a semiconductor path of only the first conductivity type, not interrupted by any further regions of the second conductivity type.

As explained above, in contrast to the diode section 1-22, the IGBT section 1-21 comprises at least one IGBT cell with a section of the source region 101 connected to the first load terminal 11 and arranged adjacent to one of the IGBT control trenches 14 and isolated from the drift region 100 by the body region 102, in accordance with an embodiment. For example, the lateral boundary of the IGBT section 1-21 is defined by the lateral boundary of the outermost IGBT cell(s). Hence, the lateral boundary of the IGBT section 1-21 may be defined at the frontside 110. This lateral boundary can be defined by (an) outermost source region(s) 101. For example, all functional elements to enable conduction of the forward/IGBT load current are present in a vertical projection of the IGBT section 1-21 of the power semiconductor device 1, e.g., including at least the first load terminal 11 (e.g., a frontside metal contact thereof, e.g., one or more of the first contact plugs 111), the source region(s) 101, the body region 102, the drift region 100, the IGBT emitter region 103, and the second load terminal 12 (e.g., a backside metal thereof). Furthermore, said functional elements may extend along the total lateral extension of the IGBT section 1-21.

In an embodiment, said first contact plugs 111 are part of a contact plug structure of the power semiconductor device 1. Each first contact plug 111 can be configured to establish contact with one of the mesas 17, 18 so as to electrically connect that mesa 17/18 to the first load terminal 11. As illustrated, each first contact plug 111 may extend from the frontside 110 along the vertical direction Z into the respective mesa 17/18.

FIG. 5 to FIG. 11 illustrate various embodiments of the RC IGBT 1. In accordance with these embodiments, the RC IGBT 1 comprises the active region 1-2 with the IGBT section 1-21 and the diode section 1-22; the semiconductor body 10 having the first side 110 and the second side 120; the first load terminal 11 at the first side 110 and the second load terminal 12 at the second side 120; the plurality of control trenches 14, 15 being arranged in parallel to each other along the first lateral direction X and extending into the semiconductor body 10 along the vertical direction Z. The plurality of control trenches 14, 15 extend into both the IGBT section 1-21 and the diode section 1-22. Each control trench 14, 15 may have a stripe configuration extending along the second lateral direction Y. The plurality of IGBT mesas 17 and the plurality of diode mesas 18 are in the semiconductor body 10. Each of at least some of the mesas 17, 18 are laterally confined, along the first lateral direction X, by at least one of the control trenches 14, 15. In the plurality of control trenches 14, 15, there are the plurality of IGBT control electrodes 141 and, electrically isolated from the IGBT control electrodes 141, the plurality of plasma control electrodes 151. Each of the IGBT control electrodes 141 and plasma control electrodes 151 is electrically isolated from both the first load terminal 11 and the second load terminal 12. The IGBT section 1-21 includes both a first subset of the IGBT control electrodes 141 and a first subset of the plasma control electrodes 151. The diode section 1-22 includes a second subset of the plasma control electrodes 151.

Figure 11:
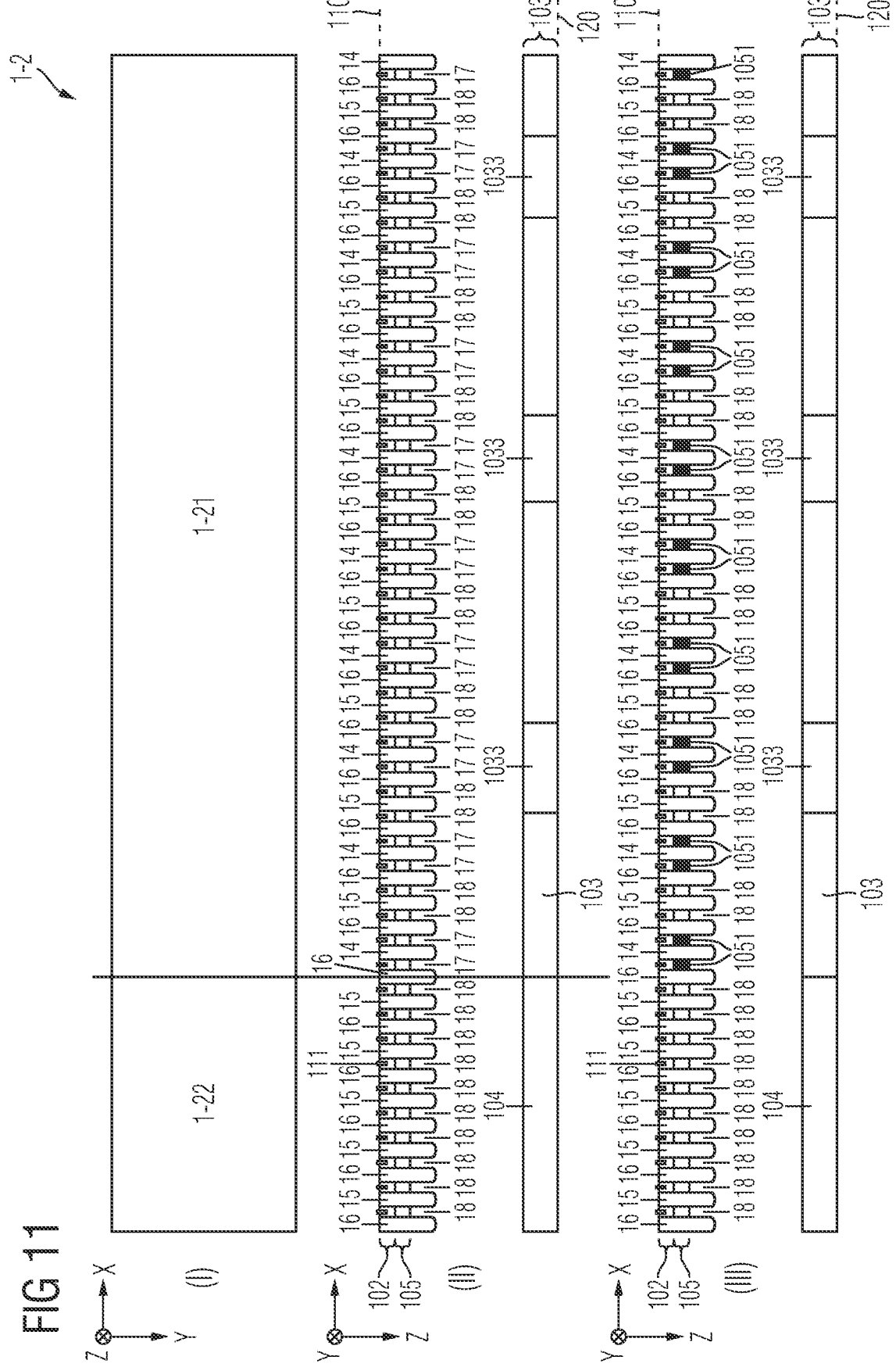
FIG. 11 schematically and exemplarily illustrates a section of a vertical cross-section and a section of a horizontal projection of an RC IGBT in accordance with one or more embodiments.

In FIGS. 5-9 and in FIG. 11, the trenches referred to with reference numerals 14, 15 and 16 are each equipped with a respective trench electrode 141/151/161 and a respective trench insulator 142/152/162 (as exemplarily illustrated in FIGS. 3-4), wherein these trench components are not provided with reference numerals in FIGS. 5-9 and in FIG. 11 for reasons of a clear representation.

The following may apply to each embodiment illustrated by FIGS. 5-11. Further, what has been described with respect to FIGS. 1-4 may equally apply to each embodiment illustrated by FIGS. 5-11:

Generally, the spatial density of the trenches (i.e., number of all trenches per lateral area unit irrespective of trench type) in the diode section 1-22 may be the same as the spatial density of the trenches in the IGBT section. In another embodiment, the trench densities may differ from each other. For example, the trench density in the diode section 1-22 amounts to less than 100% of the trench density in the IGBT section 1-21, e.g., to less than 90% or to even less than 50%.

In an embodiment, the plurality of IGBT control electrodes 141 is configured for receiving the IGBT control signal 13-21. To this end, each IGBT control electrode 141 may be electrically connected to the IGBT control terminal 13-1. Furthermore, the plurality of plasma control electrodes 151 may be configured for receiving the plasma control signal 13-22 different from the IGBT control signal 13-21. To this end, each plasma control electrode 151 may be electrically connected to the plasma control terminal 13-2. The plasma control terminal 13-2 may be electrically isolated from the IGBT control terminal 13-1. Both control terminals 13-1 and 13-2 may be arranged at the first side 110. For example, the IGBT control signal 13-21 is provided as a voltage between the IGBT control terminal 13-1 and the first load terminal 11. The plasma control signal 13-22 may be provided as a voltage between the plasma control terminal 13-2 and the first load terminal 11.

As described above, the control trenches may comprise IGBT control trenches 14 and plasma control trenches 15. The control trenches may, however, also comprise at least one multi-electrode control trench that houses two or more trench electrodes, e.g., both an IGBT control electrode 141 and a plasma control electrode 151 (cf. FIG. 10).

In an embodiment, each of the IGBT control electrodes 141 is arranged in a respective one of the control trenches 14, 15 adjacent to one of IGBT mesas 17. Such control trench may be the IGBT control trench 14. Further, each of the plasma control electrodes 151 may be arranged in a respective one of the control trenches 14, 15 adjacent to one of diode mesas 18. Such control trench may be the plasma control trench 15.

For example, each IGBT control trench 14 is configured for controlling the IGBT mesa 17 (if present) arranged adjacent to the IGBT control trench 14. Further, each plasma control trench 15 is configured for controlling the diode mesa 18 (if present) arranged adjacent to the plasma control trench 15.

In an embodiment, each IGBT mesa 17 comprises at least one of the source regions 101 of the first conductivity type and at least one of the body regions 102 of the second conductivity type, both being electrically connected to the first load terminal 11, wherein the body region 102 isolates the source region 101 from a remaining portion of a first conductivity type in the IGBT mesa 17 and forms, with said remaining portion, the pn-junction 1021 in the IGBT mesa 17.

In an embodiment, each diode mesa 18 comprises the body region 102 of the second conductivity type electrically connected to the first load terminal 11, the body region 102 forming, with a remaining portion of a first conductivity type in the diode mesa 18, the pn-junction 1021 in the diode mesa 18.

With respect to the body region 102, is shall be understood that this region may be formed substantially laterally homogenously within the active region 1-2. For example, the body region 102 must not necessarily be structured with respect to the distribution of the diode section(s) 1-22 and the IGBT section(s) 1-21 in the active region 1-2 (wherein this is an option). Thus, the above described configuration of the mesas 17 and 18 may be understood in that each of the IGBT mesas 17 and the diode mesas 18 comprises a respective portion of the formed body region 102, as illustrated in FIGS. 5-9 and 11. This likewise applies to an optionally provided barrier region 105 of the first conductivity type that has a dopant concentration at least 100 times higher as compared to the drift region 100. For example, the barrier region 105 interfaces with the body region 102 in at least one of the diode section 1-22 and the IGBT section 1-21. In an embodiment, the barrier region 105 terminates at a vertical level above the bottoms of the trenches 14, 15, 16. That is: The barrier region 105 does for example not extend below the trench bottoms.

In an embodiment, the barrier region 105 is laterally structured, e.g., in that the barrier region 105 is present in some portions of the mesas 17 and 18 and absent in other portions of the mesas 17 and 18. The structuring may be implemented in that the ratio between the portions including the barrier region 105 and the portions not including the barrier region 105 is at least 20%, at least 40% or even at least 60% higher in the mesas confined by one of the plasma control trenches 15 compared to mesas confined by one of the IGBT control trenches 14.

In an embodiment, the diode section 1-22 does not comprise any IGBT mesa 17. For example, in the diode section 1-22, there is no semiconductor region of the first conductivity type (such as the source region 101) electrically connected to the first load terminal 11. Thus, in the diode section 1-22, the semiconductor body 10 is electrically connected to the first load terminal 11 only be means of the body region 102, which is of the second conductivity type, in accordance with an embodiment. For example, each diode mesa 18 is hence void of a first conductivity type region electrically connected to the first load terminal 11.

In an embodiment, the diode section 1-22 does not comprise any IGBT control electrode 141. E.g., the diode section 1-22 can be controlled irrespective of the IGBT control signal 13-21.

As already described with respect to FIGS. 1-4, the RC IGBT 1 may comprise several diode sections 1-22. Each diode section 1-22 may be of significant dimension. E.g., at least each of some of the diode sections 1-22 has a lateral extension along the first lateral direction X amounting to at least 50% of the thickness of the drift region 100 in the vertical direction Z or to at least 50% of the thickness d of the semiconductor body in the vertical direction Z. The lateral extension along the first lateral direction X may also be greater than a multiple of the semiconductor body/drift region thickness, e.g., amount to at least four times the semiconductor body/drift region thickness.

The drift region thickness may be the distance along the vertical direction Z between the pn-junction 1021 formed by the body region 102 and a pn-junction 1031 formed by the IGBT emitter region 103. If the barrier region 104 and/or field stop layer 108 are provided, the thicknesses of these regions may be subtracted from said distance. Or the drift region thickness may be the distance along the vertical direction Z between an upper level where the average dopant concentration of the drift region 100 increases by 20% against the vertical direction Z and a lower level where the average dopant concentration of the drift region 100 increases by 20% in the vertical direction Z.

Further, at least each of some of the diode sections 1-22 may have a lateral extension along the second lateral direction Y amounting to at least the drift region thickness or to at least the semiconductor body thickness. The lateral extension along the second lateral direction Y may also be greater than a multiple of the semiconductor body/drift region thickness, e.g., amount to at least four times the semiconductor body/drift region thickness.

In an embodiment, the diode emitter region 104 is of the first conductivity type and forms a part of the diode section 1-22. The diode emitter region 104 exhibits a lateral extension in the first lateral direction X amounting to at least 50% of the drift region thickness or to at least 50% of the semiconductor body thickness d. The diode emitter region 104 may have lateral extensions in the first and second lateral directions X and Y identical to those lateral extensions of the diode section 1-22. E.g., the diode emitter region 104 is homogenously doped and not laterally structured (no variation-of the-lateral-doping-(VLD-) structure).

In an embodiment, the IGBT emitter region 103 is of the second conductivity type and forms a part of the IGBT section 1-21. The IGBT emitter region 103 exhibits a lateral extension in the first lateral direction X amounting to at least 70% of the drift region thickness or to at least 70% the semiconductor body thickness d. The IGBT emitter region 103 may have lateral extensions in the first and second lateral directions X and Y identical to those lateral extensions of the IGBT section 1-21. E.g., the IGBT emitter region 103 is homogenously doped and not laterally structured (no VLD structure). In other embodiments (cf. e.g., FIG. 9) the IGBT emitter region 103 may exhibit a VLD configuration and/or even comprise subportions of the first conductivity type.

Figure 5:
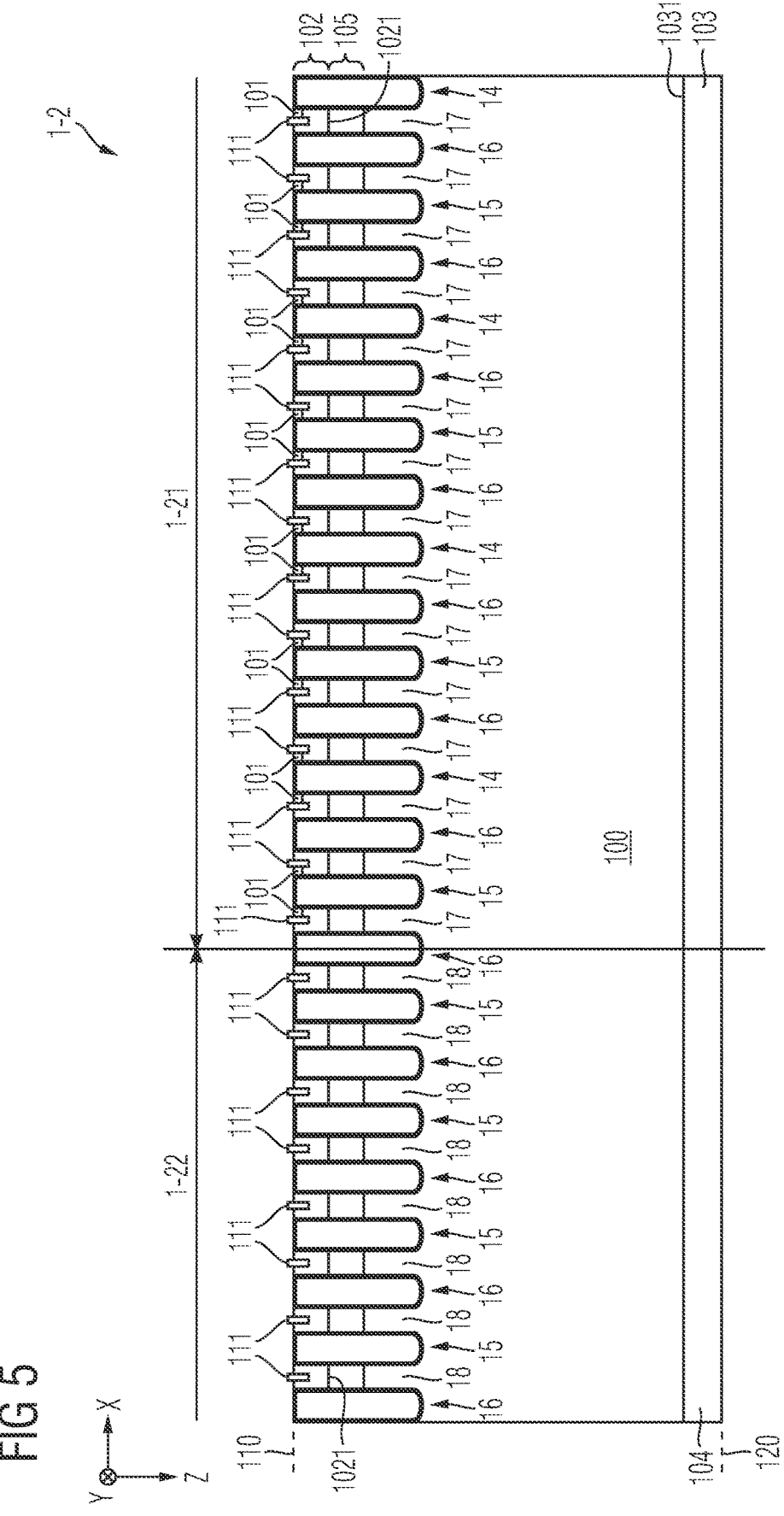

For example, as illustrated in FIG. 5, in the diode section 1-22, each plasma control trench 15 is laterally flanked by two diode mesas 18. Two adjacent diode mesas 18 are laterally spaced apart from each other by a respective source trench 16. The diode section 1-22 hence does neither include an IGBT mesa 17 nor an IGBT control trench 14. Each diode mesa 18 may laterally overlap with the diode emitter region 104 formed at the second side 120. In an embodiment, one, more or each of the source trenches 16 of the diode section 1-22 is/are replaced by a respective trench of another type, e.g., a floating trench whose trench electrode is not connected to a defined electrical potential.

If present, the spatial density of the source trenches 16 (i.e., number of source trenches per lateral area unit) in the diode section 1-22 may be the same as the spatial density of the source trenches 16 in the IGBT section 1-21. In another embodiment, the trench densities may differ from each other. For example, the source trench density in the IGBT section 1-21 amounts to less than 100% of the source trench density in the diode section 1-22, e.g., to less than 90% or to even less than 50%.

Still referring to FIG. 5, the IGBT section 1-21 (which may have minimal lateral extensions in the first and second lateral direction X, Y amounting at least the corresponding lateral extensions of the diode section 1-22, exemplary values of which being described above) is equipped with both IGBT control trenches 14 and plasma control trenches 15. That is, in contrast to the diode section 1-22, the IGBT section 1-21 may be controlled based on both the IGBT control signal 13-21 and the plasma control signal 13-22. For example, each of the IGBT mesas 17 in the IGBT section 1-21 is arranged adjacent to at least one of the IGBT control trenches 14 or one of the plasma control trenches 15. In the illustrated embodiment, the IGBT section 1-21 only comprises IGBT mesas 17, each of which being electrically connected to the first load terminal 11 via both the respective body region 102 and the respective source region 101. The trench pattern 16-15-16-14-16-15-16-14-16-15-16-14- . . . yields that each IGBT mesa 17 is laterally flanked by a respective source trench 16 at one side and, on the other side, by either a plasma control trench 15 or an IGBT control trench 14. Hence, each IGBT mesa 17 may be either controlled based on the IGBT control signal 13-21 or based on the plasma control signal 13-22, depending on the respective "trench neighborhood". E.g., such feature may be achieved in a structure with the IGBT trench 14 and the plasma control trench 15 being next to each other, if the source region 101 is only adjacent to one of these trenches 14, 15. According to an embodiment, in the IGBT mesas 17, the source region 101 may only be formed at the side adjacent to the respective control trench 14/15, and not at the side facing to the source trench 16. Each IGBT mesa 17 may laterally overlap with the IGBT emitter region 103 formed at the second side 120. In an embodiment, one, more or each of the source trenches 16 of the IGBT section 1-21 is/are replaced by a respective trench of another type, e.g., a floating trench whose trench electrode is not connected to a defined electrical potential.

Figure 6:
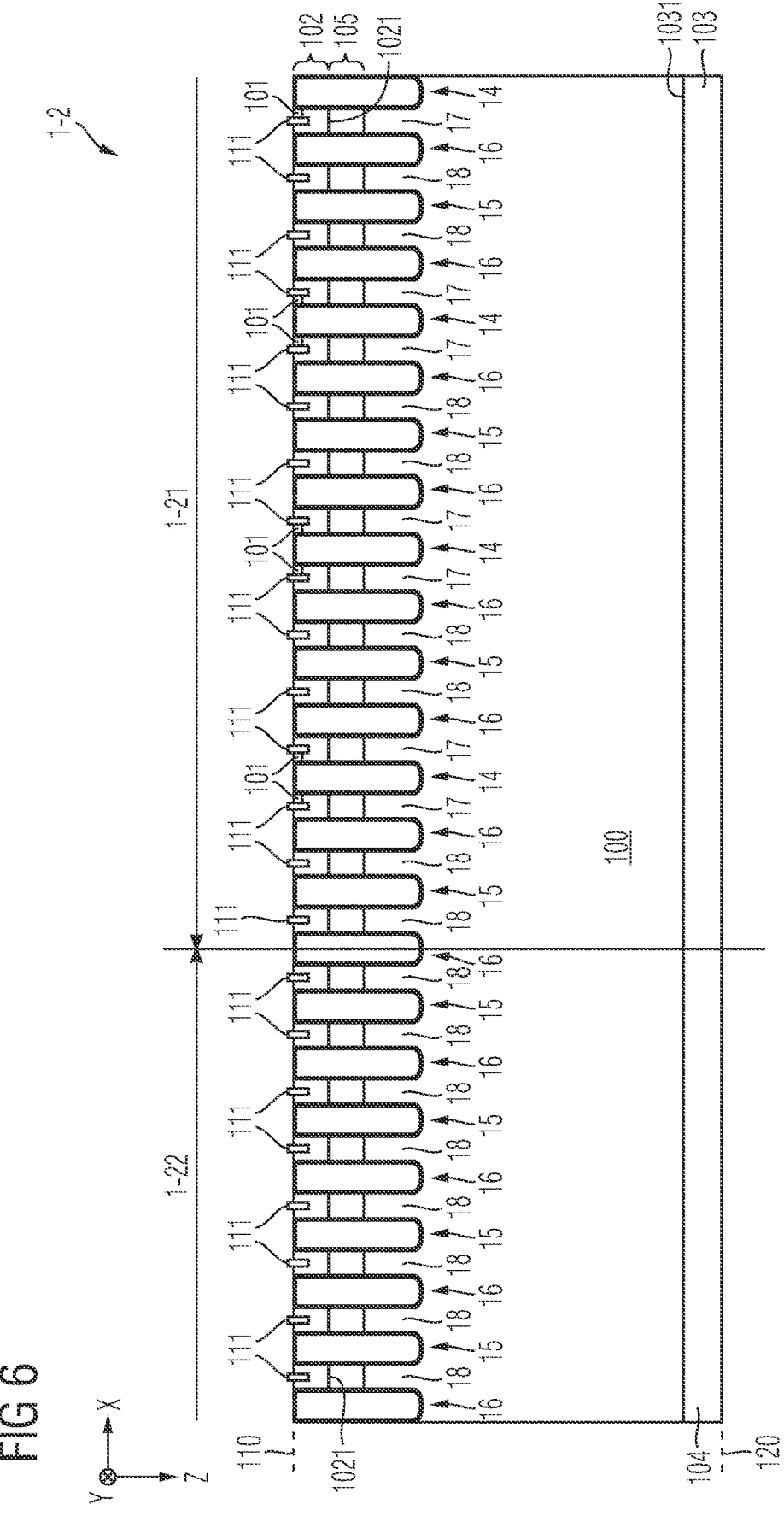

In the embodiment illustrated in FIG. 6, the diode section 1-22 is configured as in the embodiment of FIG. 5. However, the IGBT section 1-21 comprises also diode mesas 18. For example, the trench pattern is not changed compared to the embodiment of FIG. 5, but each plasma control trench 15 is laterally flanked by two of the diode mesas 18. E.g., additionally providing the diode mesas 18 in the IGBT section 1-21 may allow for achieving an improved short-circuit ruggedness, e.g., if both control signals 13-2 and 13-1 are above threshold voltage in a forward conduction state.

Figure 7:
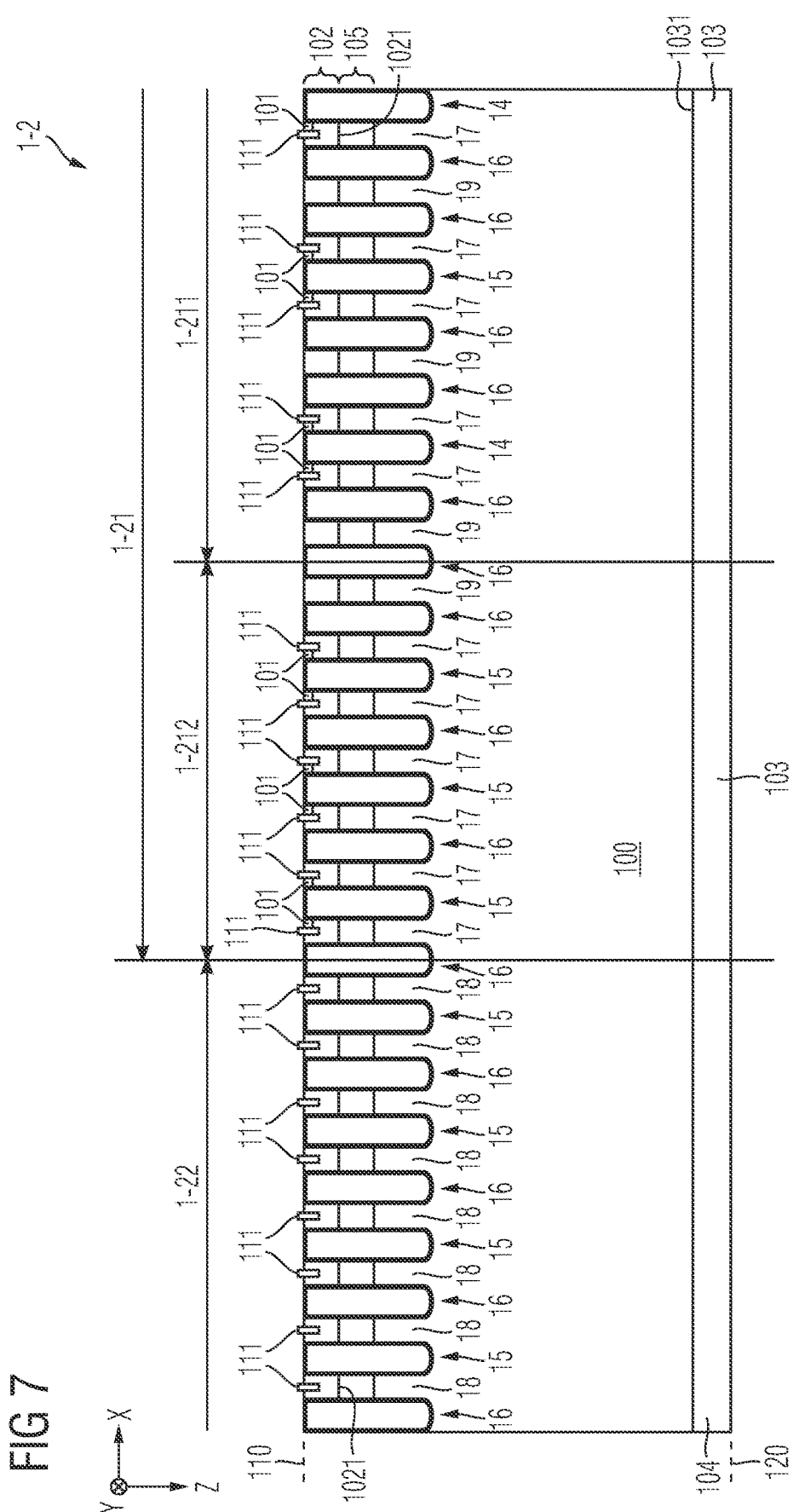

In accordance with an embodiment, e.g., as illustrated in FIG. 7 (where the diode section 1-22 may be configured as in the embodiment of FIG. 5), the IGBT section 1-21 includes a first subsection 1-211 and a second subsection 1-212. For example, in the second subsection 1-212, each IGBT mesa 17 is arranged adjacent to at least one of the plasma control trenches 15. In the first subsection 1-211, each IGBT mesa 17 may be arranged adjacent to at least one of the IGBT control trenches 14 or one of the plasma control trenches 15. For example, the second subsection 1-212 is not equipped with IGBT control trenches 14. Thus, the second subsection 1-212 of the IGBT section 1-21, e.g., its IGBT mesas 17, is/are controlled based on the plasma control signal 13-22. The first subsection 1-211 is equipped with both IGBT control trenches 14 and plasma control trenches 15. Each of IGBT control trenches 14 and plasma control trenches 15 may, in the second subsection, be laterally flanked by two of the IGBT mesas 17. For example, the IGBT section 1-21, i.e., its first and second subsections 1-211 and 1-212 may not comprise any diode mesa 18. For example, in the second subsections 1-212, each or almost each plasma control trench 15 confines a respective one of the IGBT mesas 17. In the first subsections, each or almost each plasma control trench 15 (e.g., more than 95% of the plasma control trenches 15) could (also) confine a respective one of the diode mesas 18.

In accordance with the embodiment of FIG. 7, the IGBT section 1-21 comprises one or more mesas 19 of a further type. These further type mesas 19 may be dummy mesas 19 that are not electrically connected to the first load terminal 11, which is indicated in FIG. 7 by the missing contact plug for these dummy mesas 19. E.g., one or more of the dummy mesas 19 are arranged at the transition between the first subsection 1-212 and the second subsection 1-212.

Such dummy mesas 19 may be arranged everywhere within the active region 1-2, e.g., also in the diode section 1-22.

In accordance with embodiments, the different mesa types may hence be defined based on features (a) to (c) as follows:

Each IGBT mesa 17 (a) comprises at least one of the source regions 101, (b) is laterally confined by at least one of the IGBT control trenches 14 or the plasma control trenches 15, and (c) is electrically connected to the first load terminal 11.

Each diode mesa 18 may be defined as the IGBT mesa 17, but lacking at least one of features (a) or (b).

A dummy mesa 19 may be defined as an IGBT mesa 17 or a diode mesa 18, but lacking at least feature (c).

In an embodiment, the second subsection 1-212 of the IGBT section 1-21 is arranged adjacent to the diode section 1-22. In other words, the first subsection 1-211 of the IGBT section 1-21 is laterally spaced apart from the diode section 1-22 by means of the second subsection 1-212.

Still referring to FIG. 7, each of the one or more first subsections 1-211 and the one or more second subsections 1-212 may be of significant dimension. E.g., at each of said subsections 1-211/1-212 has a lateral extension along the first lateral direction X amounting to at least 50% of the thickness of the drift region 100 in the vertical direction Z or to at least 50% of the thickness d of the semiconductor body in the vertical direction Z. The lateral extension along the first lateral direction X may also be greater than a multiple of the semiconductor body/drift region thickness, e.g., amount to at least four times the semiconductor body/drift region thickness. Further, each of said subsections 1-211/1-212 may have a lateral extension along the second lateral direction Y amounting to at least the drift region thickness or to at least the semiconductor body thickness. The lateral extension along the second lateral direction Y may also be greater than a multiple of the semiconductor body/drift region thickness, e.g., amount to at least five times the semiconductor body/drift region thickness.

Figure 8:
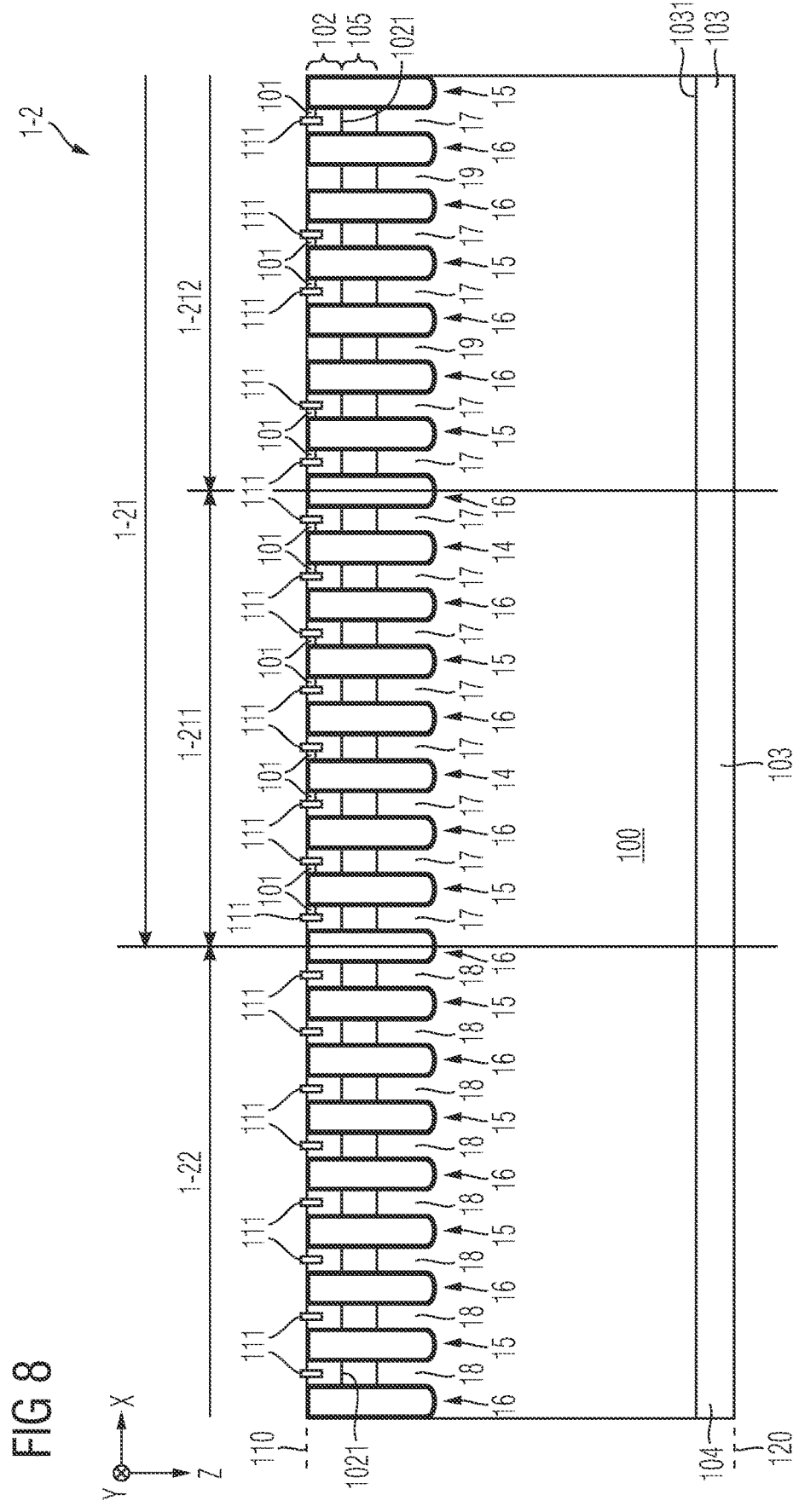

FIG. 8 illustrates a variation of the embodiment of FIG. 7 (still with the same configuration of the diode section 1-22 as explained with respect to FIG. 5). In accordance with this embodiment, the first subsection 1-211 of the IGBT section 1-21 is arranged adjacent to the diode section 1-22. In other words, the second subsection 1-212 of the IGBT section 1-21 is laterally spaced apart from the diode section 1-22 by means of the first subsection 1-211. Which way is chosen may depend on the desired thermal characteristics of the RC-IGBT 1.

Referring to both FIG. 7 and FIG. 8, the second subsection 1-212 may be arranged near the transition to the edge termination region 1-3, and/or in vicinity to a (non-illustrated) gate pad, gate finger or gate runner structure that may be present and that may be configured for transferring the plasma control signal 13-22 to the plasma control electrodes 151 or for transferring the IGBT control signal 13-21 to the IGBT control electrodes 141.

Figure 9:
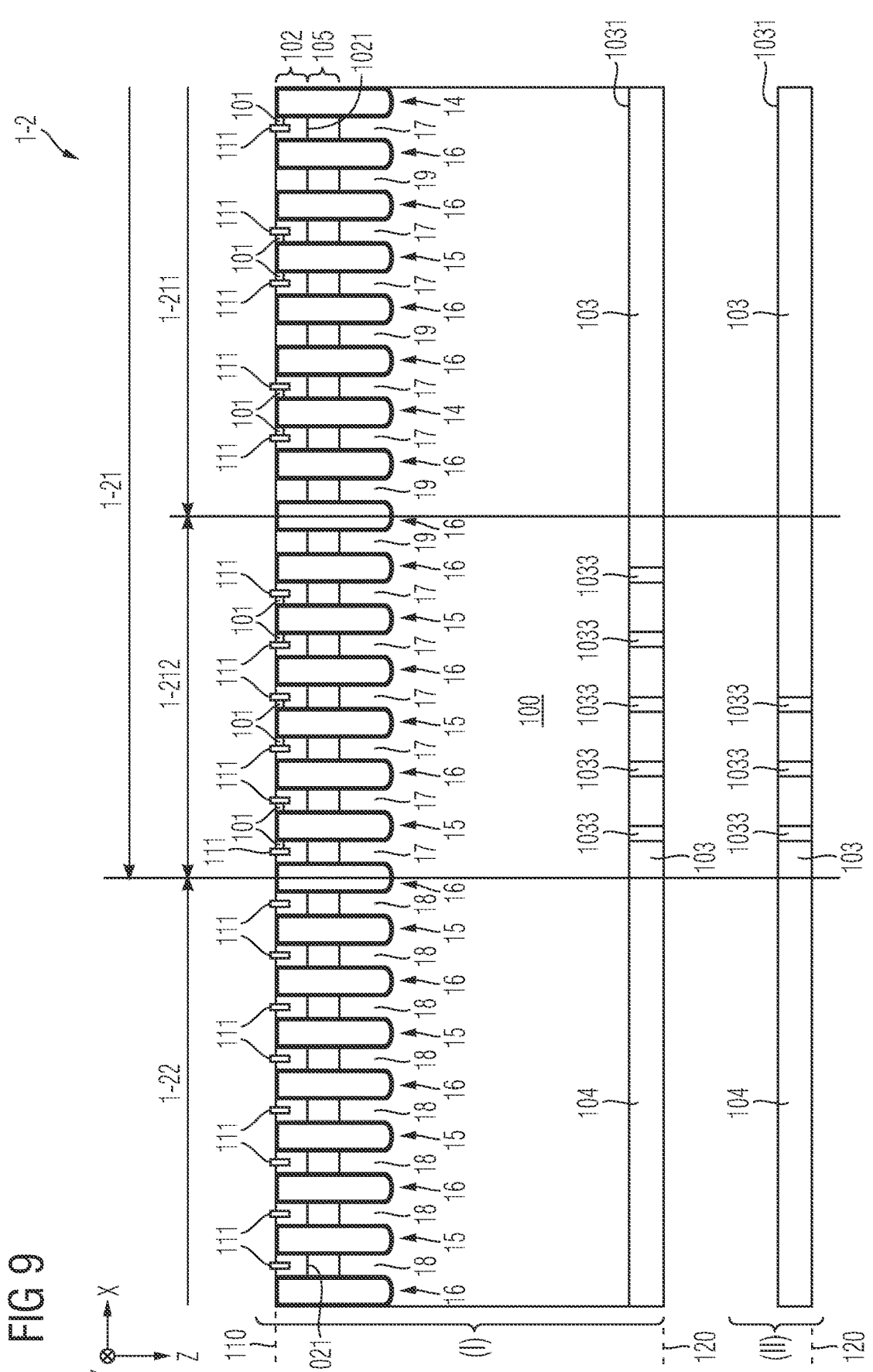

FIG. 9 illustrates another variation of the embodiment of FIG. 7 (still with the same configuration of the diode section 1-22 as explained with respect to FIG. 5). There, the positions of the first and second subsections are not amended, but the variation relates to the IGBT emitter region 103 at the second side 120.

In accordance with variant (I) of FIG. 9, the part of the IGBT emitter region 103 that extends into the second subsection 1-212 may be laterally structured, e.g., by comprising one or more subportions 1033 of the first conductivity type. The spatial density of these subportions 1033 may increase along the direction towards the diode section 1-22 (cf. variant II). The subportions 1033 are e.g. only provided in the second subsection 1-212 of the IGBT section 1-21 and not in the first subsection 1-211, where, e.g., the emitter region 103 is not structured. E.g., based on the one or more subportions 1033, the collector-side p-emitter efficiency, i.e., the emitter efficiency of the IGBT emitter region 103, is lowered, yielding a reduced current tail during turn-off.

For example, the lateral distance in the first lateral direction X between adjacent ones of the subportions 1033 may amount to a least a multiple (e.g., 3, 5 or 8 times) of the lateral distance in the first lateral direction X between adjacent ones of the IGBT mesas 17. In an embodiment, the subportions 1033 may have a stripe configuration similar to the trenches/mesas and be arranged in a staggered manner along the first lateral direction X while being coupled to the portion of the IGBT emitter region 103 in the first subsection 1-211 via a portion of the IGBT emitter region 103 in the second subsection 1-212, as exemplarily illustrated.

Figure 10:
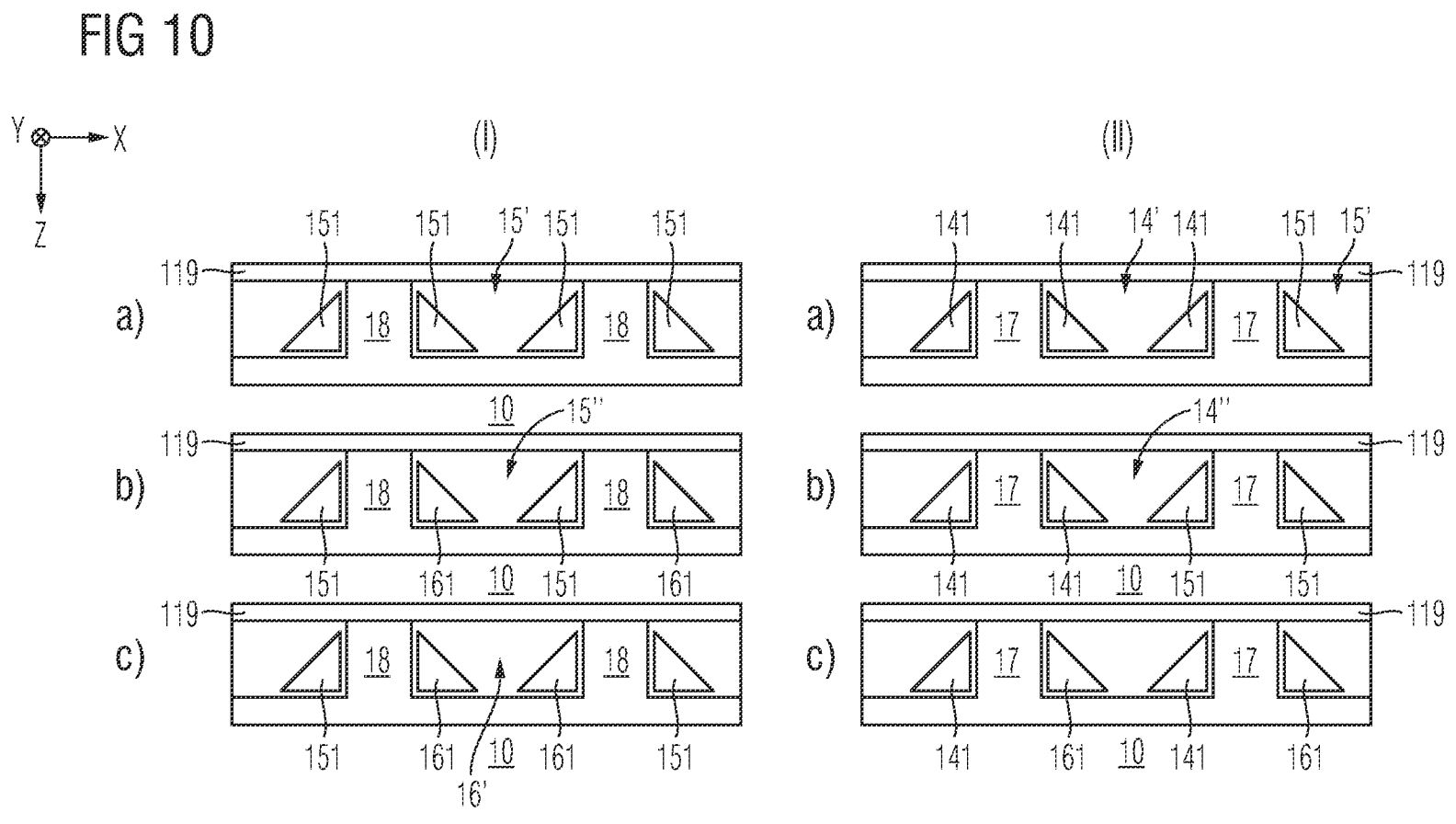

FIG. 10 illustrates schematically and exemplarily variants of trench configurations that may be arranged in the diode section 1-22 (cf. left part (I)) and the IGBT section 1-21 (cf. right part (II)). As mentioned above, instead of only one trench electrode per trench, also multi-electrode trenches may be employed.

E.g., in accordance with variant I-a), plasma control trench 15' houses two plasma control electrodes 151, each of which controlling the respective, adjacently arranged diode mesa 18. In accordance with variant I-b), plasma control trench 15" houses both one of the plasma control electrodes 151 and one of the source trench electrodes 161. In accordance with variant I-c), source trench 16' houses two of the source trench electrodes 161. Instead of the plasma control trench electrode 151, there could also be another one of the source trench electrodes 161 in variant I-c).

Now regarding possible trench configurations for the IGBT section 1-21, e.g., in accordance with variant II-a), IGBT control trench 14' houses two of the IGBT control electrodes 141, each of which controlling the respective, adjacently arranged IGBT mesa 17. In accordance with variant II-b), IGBT control trench 14" houses both one of the plasma control electrodes 151 and one of the IGBT control electrodes 141. In accordance with variant II-c), source trench 16' houses both one of the IGBT control electrodes 141 and one of the source trench electrodes 161. Further, the trenches as trenches 15', 15" and 16' may also be arranged in the IGBT section 1-21. Many variations of the trench configurations are possible.

A combination of multi-electrode trenches and single-electrode trenches in at least one of the diode section 1-22 and the IGBT section 1-21 is also possible.

In FIG. 11, part (I) shows a section of a horizontal projection of the active region 1-2. For example, only one diode section 1-22 and only one IGBT section 1-21 is included in the active region 1-2. Part (II) shows a corresponding section of a vertical cross-section of the active region 1-2 in accordance with a first example, and part (III) shows a corresponding section of a vertical cross-section of the active region 1-2 in accordance with a second example. What has been described above may equally apply to the embodiment illustrated in FIG. 11 (e.g.: the barrier region 105 may also be omitted; and/or dummy mesas 19 may be provided in the diode section 1-22 and/or in the IGBT section 1-21; the amount of source trenches 16 may be varied as described above etc.). The configuration of the diode sections 1-22 may in both examples hence be identical to the diode section 1-22 of the embodiment of FIG. 5. In both examples, the IGBT sections 1-21 exhibits the same trench-mesa pattern as illustrated (wherein the source regions 101 in the IGBT mesas 17 are present, but not illustrated for reasons of a clear representation). Each control trench 14, 15 is arranged between respective two of the source trenches. Each plasma control trench 15 is laterally flanked, on both sides, by respective two of the diode mesas 18. Each IGBT control trench 14 is laterally flanked, on both sides, by respective two of the IGBT mesas 17. Still referring to both examples, the IGBT emitter region 103 comprises said subportions 1033 of the first conductivity type. Also, the barrier region 105 is provided. In accordance with the first example (part (II) of FIG. 11), the barrier region is homogenously doped, e.g., such that it exhibits a substantially constant dopant concentration along both lateral directions X and Y. In an embodiment, as illustrated for the second example in part (III) of FIG. 11, the dopant concentration of the barrier region 105 varies along the first lateral direction X, e.g., in that its portions 1051 in the IGBT mesas 17 (reference signs missing in part (III) due to lack of space) adjacent to the IGBT control trenches 14 exhibit a greater dopant concentration as in the diode mesas 18. E.g., barrier region portions 1051 are doped at least twice as strong as the remaining portions of the barrier region 105, which may allow for reducing, during diode operation, the load current in the IGBT mesas 17 (reference signs 17 omitted in part (III) for clarity reasons).

Presented herein are not only embodiments of an RC IGBT, but also embodiments of a method of producing an RC IGBT. For example, the method comprises forming the following components: an active region with an IGBT section and a diode section; a semiconductor body having a first side and a second side; a first load terminal at the first side and a second load terminal at the second side; a plurality of control trenches being arranged in parallel to each other along a first lateral direction and extending into the semiconductor body along a vertical direction, wherein the plurality of control trenches extend into both the IGBT section and the diode section; a plurality of IGBT mesas and a plurality of diode mesas in the semiconductor body, each of at least some of the mesas being laterally confined, along the first lateral direction, by at least one of the control trenches; in the plurality of control trenches, a plurality of IGBT control electrodes and, electrically isolated from the IGBT control electrodes, a plurality of plasma control electrodes, each of the IGBT control electrodes and plasma control electrodes being electrically isolated from both the first load terminal and the second load terminal. The IGBT section includes both a first subset of the IGBT control electrodes and a first subset of the plasma control electrodes. The diode section includes a second subset of the plasma control electrodes.

For forming the components of the RC IGBT, various processing techniques may be employed, such as one or more epitaxy processing steps, one or more etch processing steps, one or more diffusion processing steps, one or more implantation processing steps, one or more tempering processing steps, one or more annealing processing steps, one or more lithography processing steps; one or more cleaning processing steps and so on.

Embodiments of the proposed RC IGBT production method correspond to the embodiments of the RC IGBT 1 presented above.

Furthermore, presented herein are also embodiments of operating an RC IGBT, e.g., an RC IGBT in accordance with one or more of the above described embodiments.

Figure 12:
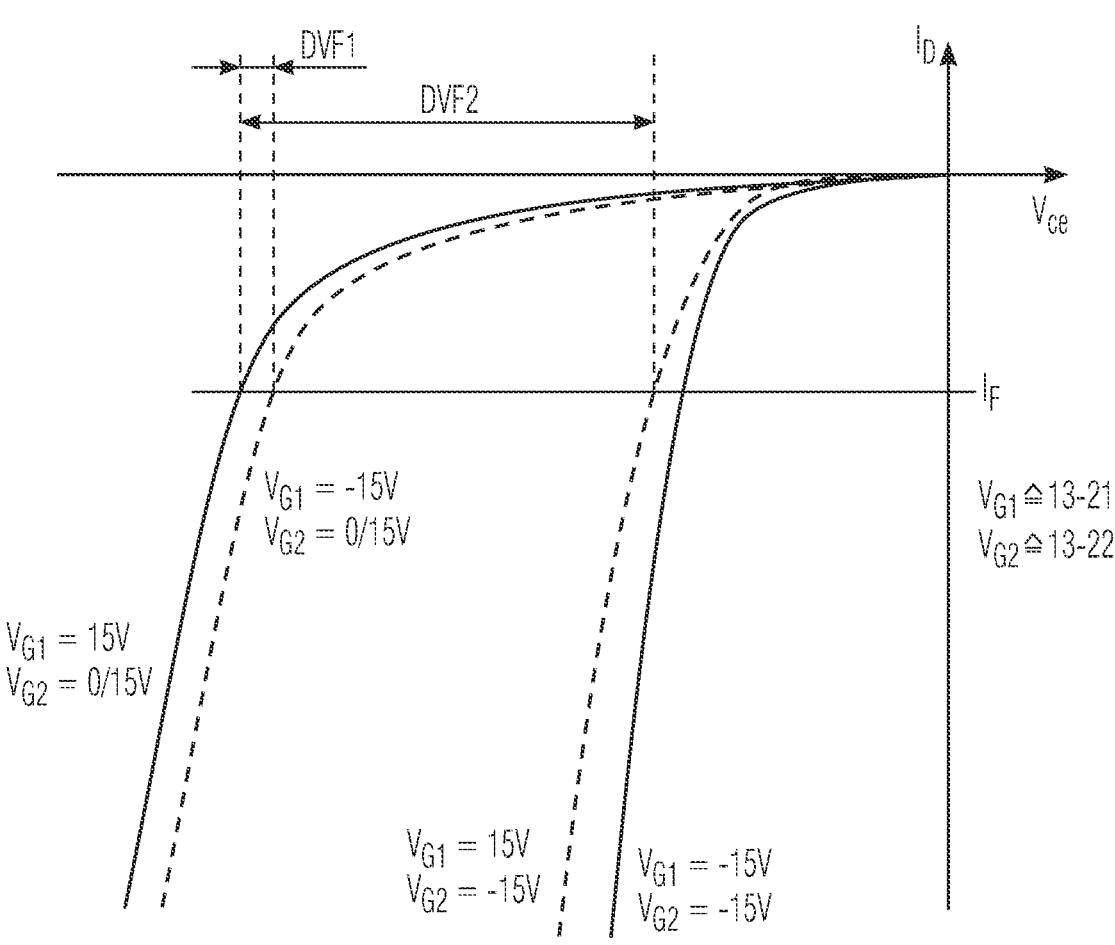
FIG. 12 schematically and exemplarily illustrates a current-voltage-characteristic related to a first control potential and a second control potential of an RC IGBT in accordance with one or more embodiments.

Regarding FIG. 12, a diode load current (i.e., the reverse current) $-I_D$ is illustrated with respect to the voltage $V_{CE}$ present between the second load terminal 12 (e.g., collector terminal) and the first load terminal 11 (e.g., emitter terminal). As explained above, in case of negative voltage $V_{CE}$, the RC IGBT 1 is in reverse/diode mode. The reverse/diode load current $-I_D$ increases (in terms of its absolute value) with increasing amount of the negative voltage $V_{CE}$, wherein the actual course may depend on the voltage of the control signals 13-21 (IGBT; G1 in FIG. 12) and 13-22 (diode; G2 in FIG. 12). The nominal reverse/diode load current is illustrated with IF in FIG. 12. A nominal current is a current for which the device has been designed.

For example, if both control signals 13-21 and 13-22 are positive (or neutral, cf. course at the left), typically a greater voltage drop is observed as comparatively few charge carriers are present. If both control signals 13-21 and 13-22 are negative, typically a lower voltage drop is observed for $I_F$, as comparatively many charge carriers are present. But, as illustrated in FIG. 12, the voltage drop for $I_F$ is approximately/almost independent from the value of the IGBT control signal 13-21. Rather, the voltage drop caused by $I_F$ may be controlled substantially by the plasma control signal 13-22. E.g., if the plasma control signal 13-22 is greater than a threshold value (of e.g. 3 V), the voltage drop is quite high, and if the plasma control signal 13-22 is lower than the threshold value (of e.g. 3 V), the voltage drop is quite low.

In an embodiment, the RC IGBT 1 may hence be designed that for IF the following applies:

a. a modification of the IGBT control signal 13-21 from an ON-value $V_{G1on}$ to an OFF-value $V_{G1off}$ (e.g., −15V, −10V, −8V or 0V) induces a first modification of the forward voltage drop DVF1 caused by $I_F$ (wherein DVF1 may accordingly be observed for the plasma control signal 13-22 being at an OFF-value $V_{G2off}$ (e.g., −15V)); and b. a modification of the plasma control signal 13-22 from an ON-value $V_{G2on}$ to an OFF-value $V_{G2off}$ (e.g., −15V, −10V, −8V) induces a second modification of the forward voltage drop DVF2 caused by $I_F$, wherein
   i. DVF1<60% DVF2; or
   ii. DVF1<30% DVF2; or
   iii. DVF1<15% DVF2.

FIG. 13 shows a semiconductor half bridge circuit 2 comprising a first RC IGBT 1-A and a second RC IGBT 1-B. A load and/or filter inductance 21 is connected to an output terminal 20 of the half bridge circuit 2 and subjected to a load current $I_L$. Load current $I_L$ may be an AC current (e.g., low frequency current, such as 50 Hz). The second load terminal of the first RC IGBT 1-A may be electrically connected to a high side of a DC supply or a DC link, and the first load terminal of the second RC IGBT 12 may be electrically connected to a low side of the DC supply or the DC link. In the illustrated example, both RC IGBTs 1-A and 1-B are only equipped with IGBT control trenches (and not with plasma control trenches) and may hence be controlled based on a first IGBT control signal 13-21A and a second IGBT control signal 13-21B. E.g., the first IGBT control signal 13-21A is gate voltage $V_{GE}$ illustrated in the upper one of the two signal diagrams in FIG. 13, and the second IGBT control signal 13-21B is gate voltage $V_{GE}$ illustrated in the lower one of the two signal diagrams in FIG. 13, for the case the direction of the load current $I_L$ is positive as indicated in FIG. 13. E.g., both RC IGBTs 1-A and 1-B are operated at a switching frequency higher than the frequency of the load current $I_L$, e.g., at some hundred Hz or at some kHz.

In accordance with the example of FIG. 13, it is determined if the respective RC IGBT is in forward or in reverse operation and then the RC IGBT is driven with a correspondingly configured IGBT control signal, e.g. with $V_{GE}=15$ V or with $V_{GE}<V_{th,n}$ (e.g. $V_{th,n}=2$V, 5V, or 6V), respectively. This results in a flexibility to optimize the overall device performance in terms of losses. Additionally, a desaturation pulse can be applied to the RC IGBT in reverse mode, e.g., directly prior to the reverse recovery. There are different options for the desaturation, as shown for the second IGBT control signal 13-21B (gate voltage $V_{GE}$ illustrated in the lower one of the two signal diagrams in FIG. 13):

(i) Desaturation at 15 V: in this case, a lock time (or dead time) between the end of the desaturation pulse and the turn-off of the other RC IGBT (in the half bridge circuit of FIG. 13: the first RC IGBT 1) may be provided in order to avoid a short circuit at the DC link.

(ii) Desaturation at 0 V (neutral desaturation): in this case, the RC IGBT operates at a negative gate potential (e.g. −8V/−10V/−15V) in the reverse on-state and desaturates at a higher gate potential ($V_{th,p}<V_{GE}<V_{th,n}$), e.g. at 0 V. Under these conditions, the RC IGBT can block the voltage also in the desaturation. Consequently, it is possible to extend the desaturation pulse to a point in time during or after the reverse recovery process, as illustrated.

In the right part of FIG. 14, the zig-zag course represents the load current $I_L$, the central sine-wave the reference current and the upper and lower sine-wave the limits. The lower pulse pattern of the PWM signal may be derived from the point where the load current $I_L$ would be below the lower limit or above the upper limit. Or the PWM signal is derived from a comparison of a sine wave with a saw-tooth signal of higher frequency. The IGBT control signals 13-21A and 13-21B may be derived from the PWM signal. The IGBT control signal 13-21B may correspond to an inverted version of the signal 13-21A. When the load current $I_L$ is positive (as indicated by the arrow at reference numeral $I_L$), the second RC IGBT 1-B is in diode/reverse mode, and when the load current $I_L$ is negative, the second RC IGBT 1-B is in IGBT/forward mode.

It may be desirable to ensure that the IGBT control signal is at 15 V (or comparable value causing the respective RC IGBT to turn-on), if the respective RC IGBT is in the forward on-state; otherwise, the device could be destroyed. That means that at least during a period 25 of the PWM signal, in which the change of the current direction of the load current $I_L$ takes place, the control voltage of the IGBT control signal has to be 15 V (or comparable value). It has been observed that there should be a critical current level (e.g. a certain percentage of the nominal device load current $I_{nom}$, such as 10%*$I_{nom}$ or 20%*$I_{nom}$) below which the RC IGBT operates at 15 V also in reverse mode. The critical current level should be rather high, since oscillations can occur in the current that may be triggered by switching events in other phases. This constraint may, however, limit the design optimization.

In accordance with an embodiment, a method of operating a power semiconductor half bridge circuit 2 comprising a first RC IGBT 1-A (cf. FIG. 16) in accordance with embodiment described above and a second RC IGBT 1-B in accordance with embodiment described above is presented. The method comprises: providing a first IGBT control signal 13-21A to the plurality of IGBT control electrodes 141 of the first RC IGBT 1-A and providing a first plasma control signal 13-22A to the plurality of the plasma control electrodes 151 of the first RC IGBT 1-A; and providing a second IGBT control signal 13-21B to the plurality of IGBT control electrodes 141 of the second RC IGBT 1-B and providing a second plasma control signal 13-22B to the plurality of the plasma control electrodes 151 of the second RC IGBT 1-B.

For example, the first IGBT control signal 13-21A is provided as a voltage between an IGBT control terminal 13-1A of the first RC IGBT 1-A and the first load terminal 11-A of the first RC IGBT 1-A. E.g., the first IGBT control signal 13-21A is a first gate signal, e.g., provided by a (non-illustrated) driver unit.

For example, the first plasma control signal 13-22A is provided as a voltage between a plasma control terminal 13-2A of the first RC IGBT 1-A and the first load terminal 11-A of the first RC IGBT 1-A. E.g., the first plasma control signal 13-22A is a second gate signal for the first RC IGBT 1-A, e.g., provided by the (non-illustrated) driver unit.

For example, the second IGBT control signal 13-21B is provided as a voltage between an IGBT control terminal 13-1B of the second RC IGBT 1-B and the first load terminal 11-B of the second RC IGBT 1-B. E.g., the second IGBT control signal 13-21B is a first gate signal for the second RC IGBT 1-B, e.g., provided by a further (non-illustrated) driver unit.

For example, the second plasma control signal 13-22B is provided as a voltage between a plasma control terminal 13-2B of the second RC IGBT 1-B and the first load terminal 11-B of the second RC IGBT 1-B. E.g., the second plasma control signal 13-22B is a second gate signal for the second RC IGBT 1-B, e.g., provided by the further (non-illustrated) driver unit.

For example, the power semiconductor half bridge circuit 2 (cf. FIG. 16, left part) e.g., as part of full bridge circuit or another circuit topology, is configured for inverting a DC input signal (e.g., the voltage across the second load terminal 12-A of the first RC-IGBT 1-A and the first load terminal 11-B of the second RC IGBT 1-B) into an AC output signal, e.g., said load current $I_L$ (cf. FIG. 14, right part).

E.g., in each half cycle of the load current $I_L$, one of the two RC IGBTs 1-A, 1-B is in diode/reverse operation and the other one is in IGBT/forward operation; after each half cycle, the operation changes from diode/reverse operation to IGBT/forward operation or, respectively, from IGBT/forward operation to diode/reverse operation.

In accordance with embodiments described herein, the RC IGBT 1-A/1-B of the half bridge circuit 2 being in IGBT/forward operation may be controlled in a conventional manner, e.g., at least based on the first IGBT control signal 13-21A or, respectively, at least based on the second IGBT control signal 13-21B. Additionally, the RC IGBT 1-A/1-B of the half bridge circuit 2 being in IGBT/forward operation may be controlled also based on the first plasma control signal 13-22A or, respectively, based on the second plasma control signal 13-22B.

Further in accordance with embodiments described herein, the first plasma control signal 13-22A and the second plasma control signal 13-22B may be provided in dependence of a current direction of the load current $I_L$. For example, the RC IGBT 1-A/1-B of the half bridge circuit 2 being in diode/reverse operation may be controlled at least based on the first plasma control signal 13-22A or, respectively, at least based on the second plasma control signal 13-22B that may both be generated in dependence of a current direction of the load current $I_L$. Additionally, the RC IGBT 1-A/1-B of the half bridge circuit 2 being in diode/ reverse operation may be controlled also based on the first IGBT control signal 13-21A or, respectively, based on the second IGBT control signal 13-21B.

The method may hence further comprise detecting a direction of a half bridge load current $I_L$ and providing both the first plasma control signal 13-22A and the second plasma control signal 13-22B in dependence of the detected load current direction.

Figure 15:
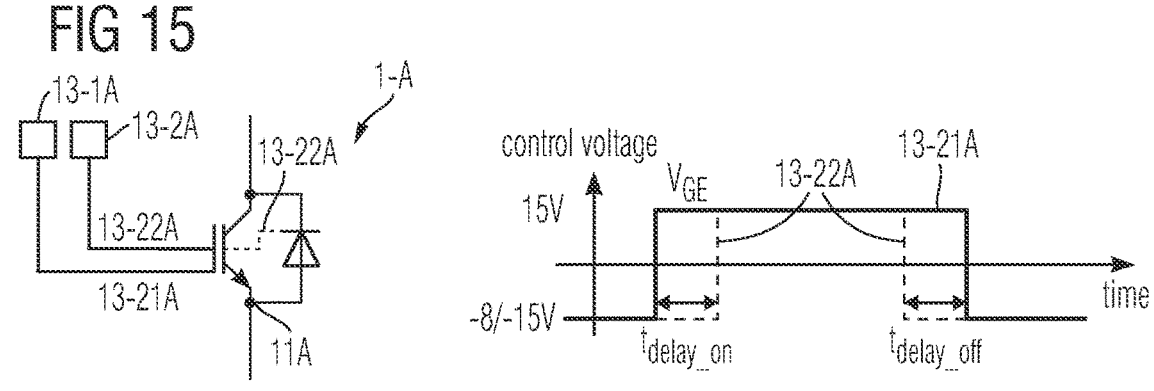

For example, referring to FIG. 15, if the first RC IGBT 1-A is in IGBT/forward operation, it may be desaturated based on the first plasma control signal 13-22A prior to being turned-off based on the first IGBT control signal 13-21A, e.g., a few μs before being turned-off (cf. Fig. $t_{delay\_off}$=3 μs).

The desaturation durations may depend on the thickness of the semiconductor body. E.g., the desaturation duration, in μs, has an amount in the range of the semiconductor body thickness (in μm) divided by 50 to the semiconductor body thickness (in μm) divided by ten.

Alternatively or additionally, still when the first RC IGBT 1-A is in IGBT/forward operation, "turning-on" also the IGBT mesas 17 controlled by the plasma control trenches 15 may be delayed based on the first plasma control signal 13-22A, e.g., by a few μs after being turned-on based on the first IGBT control signal 13-21A (cf. Fig. $t_{delay\_on}$=3 μs). Of course, any other suitable delay times may be chosen depending on the actual application. The first plasma control signal 13-22A may hence for example be provided such that it triggers a desaturation operation prior to a turn-off operation triggered by the first IGBT control signal 13-21A and/or such that it triggers a turn-on operation after a turn-on operation triggered by the first IGBT control signal 13-21A. In another embodiment, if the first RC IGBT 1-A is in IGBT/forward operation, the first plasma control signal 13-22A is switched simultaneously with the first IGBT control signal 13-21A and/or as the same magnitude as the first IGBT control signal 13-21A. That is, in such embodiment, the first plasma control signal 13-22A may be identical to the first IGBT control signal 13-21A. Of course, the description in this paragraph applies analogously to the second RC IGBT 1-B when the second RC IGBT 1-B is in IGBT/forward operation.

In FIG. 16, the first RC-IGBT 1-A is in IGBT operation (which is herein also referred to as forward operation or as IGBT/forward operation) and the second RC IGBT 1-B is in diode operation (which is herein also referred to as reverse operation or as diode/reverse operation). The upper of the two signal course diagrams hence illustrates what has been described in the preceding paragraph: The first plasma control signal 13-22A is provided such that it triggers a desaturation operation prior to a turn-off operation triggered by the first IGBT control signal 13-21A (cf. $t_{delay\_off}$) and such that it triggers a turn-on operation after a turn-on operation triggered by the first IGBT control signal 13-21A (cf. $t_{delay\_on}$). For example, the second IGBT control signal 13-21B is provided as an inverted version of the first IGBT control signal 13-21A (of course, including dead-time to avoid short circuiting the DC link). In an embodiment, when the second RC IGBT 1-B is in diode mode, the second plasma control signal 13-22 is provided such it triggers a desaturation operation prior at an end of an on-pulse defined by the second IGBT control signal 13-21B. For example, the desaturation operation is triggered based on an on-pulse of the second plasma control signal 13-22B. E.g., the on-pulse of the second plasma control signal 13-22B is within a time frame defined by the on-pulse of the second IGBT control signal 13-21B and/or exhibits the same magnitude as the on-pulse of the second IGBT control signal 13-21B (cf. variant (i) in FIG. 16). Or, the on-pulse of the second plasma control signal 13-22B supersedes a time frame defined by the on-pulse of the second IGBT control signal 13-21B and/or exhibits a lower magnitude (e.g., 0 V) as the on-pulse of the second IGBT control signal 13-21B (cf. variant (ii) in FIG. 16).

The description in the preceding paragraph related to FIG. 16, where the first RC-IGBT 1-A is in IGBT operation and the second RC IGBT 1-B is in diode operation. Of course, it shall be understood that the description of the control signal courses applies analogously if the first RC-IGBT 1-A is in diode operation and the second RC IGBT 1-B is in IGBT operation.

Figure 17:
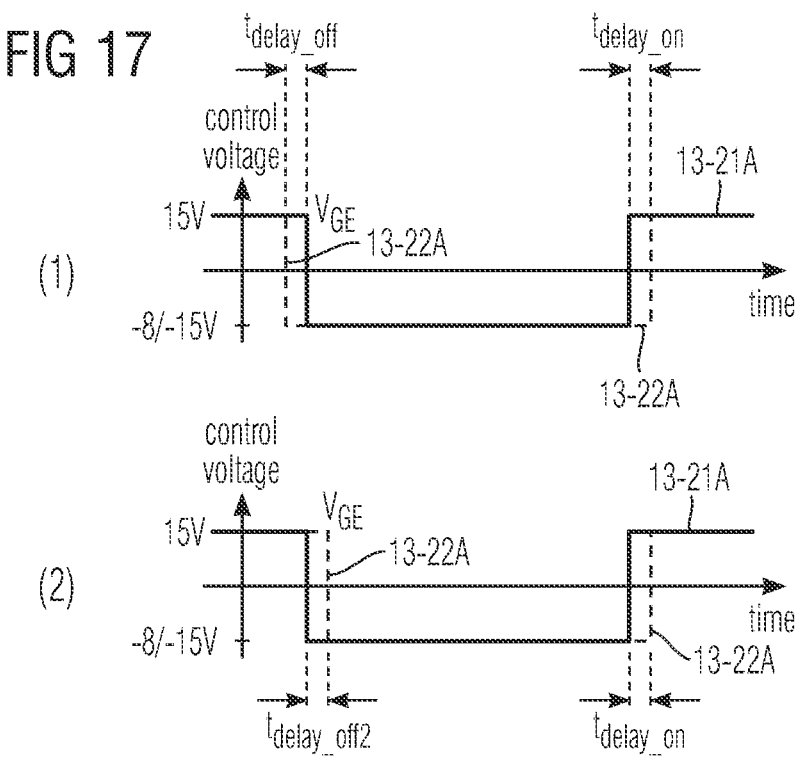

Now referring to FIG. 17, two variants of controlling the first RC IGBT 1-A in IGBT operation based on both the first IGBT control signal 13-21A and the first plasma control signal 13-22A shall be described. This description applies analogously to the second RC IGBT if the same is not in diode operation, but in IGBT operation. Variant (1) in FIG. 17 corresponds to the manner of controlling the first RC IGBT 1-A as described already with respect to FIG. 16 and FIG. 15. There, the first plasma control signal 13-22A is provided such that it triggers a desaturation operation prior to a turn-off operation triggered by the first IGBT control signal 13-21A (cf. $t_{delay\_off}$) and such that it triggers a turn-on operation after a turn-on operation triggered by the first IGBT control signal 13-21A (cf. $t_{delay\_on}$). But, depending on the chip design of the RC IGBT 1-A, e.g., if the RC IGBT 1-A has IGBT mesas 17 arranged adjacent to plasma control trenches 15 (cf. FIG. 7, first subsection 1-211), it may be appropriate that the desaturation before turn-off is induced based on the first IGBT control signal 13-21A, as illustrated in variant (2) of FIG. 17. For example, the first plasma control signal 13-22A is hence provided such that it triggers a desaturation operation after a turn-off operation triggered by the first IGBT control signal 13-21A (cf. $t_{delay\_off2}$) and/or such it triggers a turn-on operation after a turn-on operation triggered by the first IGBT control signal 13-21A (cf. $t_{delay\_on}$). So here, the first plasma control signal 13-22A may indeed be the "main" gate signal.

Figure 18:
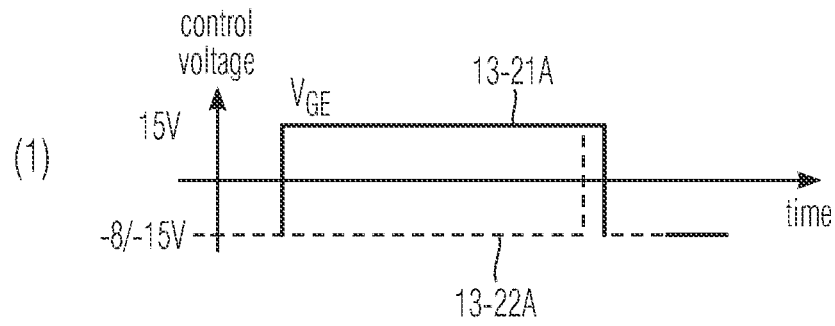
Figure 18:
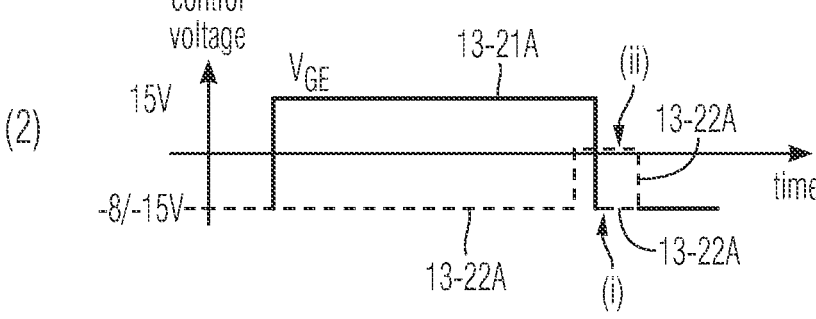
Figure 18:
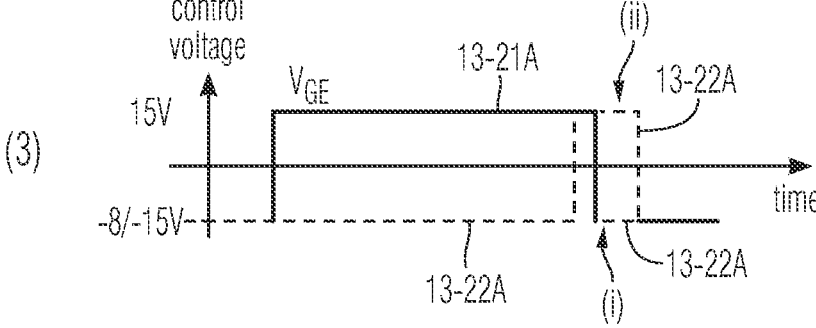

Now reverting to FIG. 18, exemplary plasma control schemes shall be described with respect to the first RC IGBT 1-A (i.e., when the first RC IGBT 1-A is in diode operation and the second RC IGBT 1-B is in IGBT operation). As has been explained above with respect to FIG. 16 (where the situation of the RC IGBTs was complementary) the first plasma control signal 13-22A is provided such it triggers a desaturation operation prior at an end of an on-pulse defined by the first IGBT control signal 13-21A.

For example, the desaturation operation is triggered based on an on-pulse of the first plasma control signal 13-22A. FIG. 18 shows some variants (1)-(3) of such on-pulse (which hence can be considered as a desaturation pulse). E.g., the on-pulse of the first plasma control signal 13-22A is within a time frame defined by the on-pulse of the first IGBT control signal 13-21A (cf. variant (1), variant (2)-(i) and variant (3)-(i)) For example, the duration of the on-pulse of the first plasma control signal 13-22A amounts to less than 30% or less than 10% of the duration of the on-pulse of the first IGBT control signal 13-21A (cf. all variants in FIG. 18).

The desaturation durations may depend on the thickness d of the semiconductor body 10. E.g., the desaturation duration, in μs, has an amount in the range of the semiconductor body thickness d (in μm) divided by 50 to the semiconductor body thickness d (in μm) divided by ten.

Further, the on-pulse of the first plasma control signal 13-22A may terminate at the same point of time as the on-pulse of the first IGBT control signal 13-21A (cf. variant (1), variant (2)-(i) and variant (3)-(i)). Further, the on-pulse of the first plasma control signal 13-22A can exhibit the same magnitude as the on-pulse of the first IGBT control signal 13-21A (cf. variants (i) and (iii) FIG. 16). Or, the on-pulse of the first plasma control signal 13-22A supersedes a time frame defined by the on-pulse of the first IGBT control signal 13-21A (variant (2)-(ii) and variant (3)-(ii)) and/or exhibits a lower magnitude (e.g., lower than 70% or lower than 55%) as the on-pulse of the first IGBT control signal 13-21A (cf. variant (2)-(i) and variant (2)-(ii)).

The configuration of the desaturation pulse for the diode operation may be chosen depending on the chosen design of the chip design of the RC IGBT, many examples of which have been presented above. In accordance with some embodiments, the following may apply: For variant (2) (*i*) and (ii) in FIG. 18, the mesa width may be smaller than 1.5 μm, smaller than 1 μm, smaller than 600 nm and/or the dopant dose of the barrier region 105 may be higher than $8*10^{12}$ cm$^{-2}$, $1*10^{13}$ cm$^{-2}$ or even higher than $3*10^{13}$ cm$^{-2}$. For variant (3) (*ii*) in FIG. 18, there are, e.g., no IGBT mesa 17 is arranged adjacent to one of the plasma control trenches 15. For the variant (1) in FIG. 18, there may be at least one substructure within the diode section 1-22, in which the minimum distance between two plasma control trenches 15 is at least 20%, or at least 40%, or at least 70% of the semiconductor body thickness d.

In accordance with one or more embodiments, an amplitude range of the first plasma control signal 13-22A amounts to less than 70%, or to even less than 50%, of an amplitude range of the first IGBT control signal 13-21A (cf. e.g. variants (2) in FIG. 18. The amplitude range of the second plasma control signal 13-22B may correspondingly amount to less than 70%, or to even less than 50%, of an amplitude range of the second IGBT control signal 13-21B. For example, the respective plasma control signal may be in the range of –8 V to 15 V, or in the range of –8V to 0 V, whereas the respective IGBT control signal may be in the range of –15 V to 15 V. In another embodiment, the off-voltages of the IGBT control signals 13-21A and 13-21-B are higher (e.g., 0V) than for the plasma control signals 13-22A and 13 22B (e.g., –8V, –10V, or –15V).

In accordance with one or more embodiments, the half bridge circuit 2 is operated at a switching frequency, wherein the relationships between the control signals 13-21A/B, 13-22A/B as described above are obeyed in each period of the switching frequency. The switching frequency can be within the range of 100 Hz to 100 kHz.

In accordance with embodiments of the method described herein, both RC IGBTs 1-A und 1-B, when being in the IGBT/forward mode, may be controlled in a conventional way based at least on the respective IGBT control signal 13-21A/B. Optionally, it is possible to control both RC IGBTs 1-A und 1-B, when being in the IGBT/forward mode in addition, also based on the respective plasma control signal 13-22A/B, e.g., in order to desaturate the respective RC-IGBT 1-A/B prior or after turn-off (cf. FIG. 17 for an example, "t$_{delay\_off}$" "t$_{delay\_off2}$"). E.g., in accordance with FIG. 17, variant (2), the IGBT control signal 13-21A triggers the desaturation, and the plasma control signal 13-22A initializes the turn-off process. In the IGBT mode, both the respective IGBT control signal 13-21A/B and the respective plasma control signal 13-22A/B may exhibit substantially identical pulse widths, the optional difference being in the time delays as exemplarily illustrated in FIG. 17, cf. "t$_{de-}$ $_{lay\_off}$" or "t$_{delay\_off2}$" and/or "t$_{delay\_on}$", wherein, as described above, also synchronous signal courses are possible, where hence the respective IGBT control signal 13-21A/B and the respective plasma control signal 13-22A/B are identical to each other.

In accordance with embodiments of the method described herein, both RC IGBTs 1-A und 1-B, when being in the diode/reverse mode, may be controlled in a conventional way based at least on the respective IGBT control signal 13-21A/B. For example, the first IGBT control signal 13-21A is an inverted version of the second IGBT control signal 13-21B (obeying dead-times). Optionally, it is possible to control both RC IGBTs 1-A und 1-B, when being in the diode/reverse mode, also based on the respective plasma control signal 13-22A/B, e.g., in order to desaturate the respective RC-IGBT 1-A/B around turn-off time (cf. FIG. 18). In the diode mode, the respective IGBT control signal 13-21A/B and the respective plasma control signal 13-22A/B may exhibit substantially different pulse widths. E.g., pulse width of the plasma control signal is less than 50% or less than 30% or even less than 10% of the IGBT control signal pulse width (cf. FIG. 18). Not only the pulse width may be smaller, but also the amplitude range of the plasma control signal compared to the IGBT control signal. The pulse of the plasma control signal may occur at various times around turn-off time defined by the IGBT control signal, as has been explained with respect to FIG. 18. That is, during diode operation and based on the plasma control signal, a defined desaturation operation may be carried out around turn-off (based on the IGBT control signal) of the RC IGBT. The shape of the desaturation pulse may be adjusted based on the configuration of the RC IGBT, many examples of which have been presented above with respect to FIGS. 1-11.

The method may comprise detecting the operation type (diode operation or IGBT operation) based on the half bridge load current (cf. reference numeral $I_L$) and providing the respective plasma control signal either in accordance with IGBT operation scheme (e.g., FIG. 17) or in accordance with the diode operation scheme (e.g., FIG. 18) in dependence of the detected half bridge load current direction.

In a further embodiment, the RC IGBT 1 may be operated with different $V_{GEmin}$ values for plasma control signal 13-22A (e.g. –15, –8V, –5V, 0V, 3V, 10V, 15V). E.g., for a low switching frequency, for which on-state losses are of high importance, $V_{GEmin}$ is at a low level, e.g. smaller than –5V, smaller than –8V, smaller than –13V. For higher switching frequencies, $V_{GEmin}$ may be increased to a higher level, e.g. higher than –8V, higher than –3V or even higher than 3V. Optionally, the desaturation methods according to FIG. 18 can be applied.

In the above, embodiments pertaining to power semiconductor device, such as RC IGBTs, and corresponding processing methods were explained. For example, these power semiconductor device are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, Si, SiC, GaAs and GaN.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An RC IGBT (reverse conducting insulated gate bipolar transistor), comprising:
an active region with an IGBT section and a diode section;
a semiconductor body having a first side and a second side;
a first load terminal at the first side and a second load terminal at the second side;
a plurality of control trenches arranged in parallel to each other along a first lateral direction and extending into the semiconductor body along a vertical direction, wherein the plurality of control trenches extend into both the IGBT section and the diode section;
a plurality of IGBT mesas and a plurality of diode mesas in the semiconductor body, each of at least some of the IGBT mesas and diode mesas being laterally confined, along the first lateral direction, by at least one of the control trenches; and
in the plurality of control trenches, a plurality of IGBT control electrodes configured to receive an IGBT control signal and, electrically isolated from the IGBT control electrodes, a plurality of plasma control electrodes configured to receive a plasma control signal different from the IGBT control signal, each of the IGBT control electrodes and plasma control electrodes being electrically isolated from both the first load terminal and the second load terminal and separated from the semiconductor body by a respective trench insulator formed along sidewalls and a bottom of the control trenches,
wherein the IGBT section includes a first subset of the IGBT control electrodes, a first subset of the plasma control electrodes, and one or more source trenches having a source trench electrode electrically connected to the first load terminal and separated from the semiconductor body by a respective trench insulator formed along sidewalls and a bottom of the one or more source trenches,
wherein the diode section includes a second subset of the plasma control electrodes, wherein
the IGBT section includes a first subsection and a second subsection, wherein in the second subsection, at least one IGBT mesa is arranged adjacent to at least one of the control trenches that includes one of the plasma control electrodes, and wherein in the first subsection, at least one IGBT mesa is arranged adjacent to the at least one of the control trenches that includes at least one of the plasma control electrodes and at least one IGBT mesa is arranged adjacent to at least one of the control trenches that includes one of the IGBT control electrodes.

2. The RC IGBT of claim 1, wherein each of the IGBT control electrodes is arranged in a respective one of the control trenches adjacent to one of the IGBT mesas.

3. The RC IGBT of claim 1, wherein each of the plasma control electrodes is arranged in a respective one of the control trenches adjacent to one of the diode mesas.

4. The RC IGBT of claim 1, wherein each IGBT mesa comprises a source region of a first conductivity type and a body region of a second conductivity type, both being electrically connected to the first load terminal, and wherein the body region isolates the source region from a remaining portion of a first conductivity type in the IGBT mesa and forms, with the remaining portion, a pn-junction in the IGBT mesa.

5. The RC IGBT of claim 1, wherein the diode section does not comprise any IGBT mesa.

6. The RC IGBT of claim 1, wherein each diode mesa comprises a body region of a second conductivity type electrically connected to the first load terminal, the body region forming, with a remaining portion of a first conductivity type in the diode mesa, a pn-junction in the diode mesa.

7. The RC IGBT of claim 1, wherein each diode mesa is void of a first conductivity type region electrically connected to the first load terminal.

8. The RC IGBT of claim 1, further comprising a plurality of diode sections, wherein each of at least two of the diode sections has a lateral extension along the first lateral direction amounting to at least a thickness of a drift region of the RC IGBT in the vertical direction or to at least a thickness of the semiconductor body in the vertical direction.

9. The RC IGBT of claim 8, wherein each of the at least two diode sections further has a lateral extension along the second lateral direction amounting to at least the drift region thickness or to at least the semiconductor body thickness.

10. The RC IGBT of claim 1, further comprising a barrier region of a first conductivity type, the barrier region interfacing with a body region in at least one of the diode section and the IGBT section, and having a dopant concentration at least 100 times higher as compared to a drift region of the RC IGBT.

11. The RC IGBT of claim 1, wherein both the first subsection and the second subsection have a lateral extension in the second lateral direction amounting to at least a drift region thickness or to at least the semiconductor body thickness.

12. The RC IGBT of claim 1, further comprising, in the semiconductor body and at the second side, both:
a diode emitter region of a first conductivity type that forms a part of the diode section and that has a lateral extension in the first lateral direction amounting to at least 50% of a drift region thickness or to at least 50% of the semiconductor body thickness; and
an IGBT emitter region of a second conductivity type that forms a part of the IGBT section and has exhibits a lateral extension in the first lateral direction amounting to at least 70% of the drift region thickness or to at least 70% of the semiconductor body thickness.

13. A method of operating a power semiconductor half bridge circuit comprising a first RC IGBT of claim 1 and a second RC IGBT of claim 1, comprising:
providing a first IGBT control signal to the plurality of IGBT control electrodes of the first RC IGBT and a first plasma control signal to the plurality of the plasma control electrodes of the first RC IGBT; and providing a second IGBT control signal to the plurality of IGBT control electrodes of the second RC IGBT and a second plasma control signal to the plurality of the plasma control electrodes of the second RC IGBT.

14. The method of claim 13, further comprising:

detecting a direction of a half bridge load current; and providing both the first plasma control signal and the second plasma control signal in dependence of the detected load current direction.

15. The method of claim 13, wherein if the first RC-IGBT is in an IGBT operation and the second RC IGBT is in a diode operation, the first plasma control signal is provided such that:

the first plasma control signal triggers a desaturation operation prior to a turn-off operation triggered by the first IGBT control signal; and/or the first plasma control signal triggers a turn-on operation after a turn-on operation triggered by the first IGBT control signal.

16. The method of claim 13, wherein the second IGBT control signal corresponds to an inverted version of the first IGBT control signal.

17. The method of claim 13, wherein if the first RC-IGBT is in an IGBT operation and the second RC IGBT is in a diode operation, the second plasma control signal is provided such that the second plasma control signal triggers a desaturation operation prior at an end of a an on-pulse defined by the second IGBT control signal.

18. The method of claim 17, wherein the desaturation operation is triggered based on an on-pulse of the second plasma control signal, wherein the on-pulse of the second plasma control signal is within a time frame defined by the on-pulse of the second IGBT control signal and/or has the same magnitude as the on-pulse of the second IGBT control signal.

19. The method of claim 17, wherein the desaturation operation is triggered based on an on-pulse of the second plasma control signal, wherein the on-pulse of the second plasma control signal supersedes a time frame defined by the on-pulse of the second IGBT control signal and/or has a lower magnitude as the on-pulse of the second IGBT control signal.

20. The method of claim 13, wherein if the first RC-IGBT is in an IGBT operation and the second RC IGBT is in a diode operation, the first plasma control signal is provided such that:

the first plasma control signal triggers a desaturation operation after a turn-off operation triggered by the first IGBT control signal; and/or the first plasma control signal triggers a turn-on operation after a turn-on operation triggered by the first IGBT control signal.

21. The method of claim 13, wherein an amplitude range of the first plasma control signal amounts to less than 70% of an amplitude range of the first IGBT control signal, and/or wherein an amplitude range of the second plasma control signal amounts to less than 70% of an amplitude range of the second IGBT control signal.

22. The method of claim 13, wherein the half bridge circuit is operated at a switching frequency, and the wherein one or more relationships between the control signals are obeyed in each period of the switching frequency.

23. The method of claim 22, wherein the switching frequency is within the range of 100 Hz to 100 kHz.

24. The method of claim 13, wherein:

the first IGBT control signal is provided as a voltage between an IGBT control terminal of the first RC IGBT and the first load terminal of the first RC IGBT;

the first plasma control signal is provided as a voltage between a plasma control terminal of the first RC IGBT and the first load terminal of the first RC IGBT;

the second IGBT control signal is provided as a voltage between an IGBT control terminal of the second RC IGBT and the first load terminal of the second RC IGBT; and the second plasma control signal is provided as a voltage between a plasma control terminal of the second RC IGBT and the first load terminal of the second RC IGBT.

25. A method of producing an RC-IGBT, the method comprising:

forming an active region with an IGBT section and a diode section;

forming a first load terminal at a first side of a semiconductor body and a second load terminal at a second side of the semiconductor body;

forming a plurality of control trenches arranged in parallel to each other along a first lateral direction and extending into the semiconductor body along a vertical direction, wherein the plurality of control trenches extend into both the IGBT section and the diode section;

forming a plurality of IGBT mesas and a plurality of diode mesas in the semiconductor body, each of at least some of the IGBT mesas and diode mesas being laterally confined, along the first lateral direction, by at least one of the control trenches; and forming in the plurality of control trenches, a plurality of IGBT control electrodes configured to receive an IGBT control signal and, electrically isolated from the IGBT control electrodes, a plurality of plasma control electrodes configured to receive a plasma control signal different from the IGBT control signal, each of the IGBT control electrodes and the plasma control electrodes being electrically isolated from both the first load terminal and the second load terminal and separated from the semiconductor body by a respective trench insulator formed along sidewalls and a bottom of the control trenches, wherein the IGBT section includes a first subset of the IGBT control electrodes, a first subset of the plasma control electrodes, and one or more source trenches having a source trench electrode electrically connected to the first load terminal and separated from the semiconductor body by a respective trench insulator formed along sidewalls and a bottom of the one or more source trenches, wherein the diode section includes a second subset of the plasma control electrodes, wherein the IGBT section includes a first subsection and a second subsection, wherein in the second subsection, at least one IGBT mesa is arranged adjacent to at least one of the control trenches that includes one of the plasma control electrodes, and wherein in the first subsection, at least one IGBT mesa is arranged adjacent to the at least one of the control trenches that includes at least one of the plasma control electrodes and at least one IGBT mesa is arranged adjacent to at least one of the control trenches that includes one of the IGBT control electrodes.

* * * * *